(12) United States Patent
Kurihara et al.

(10) Patent No.: US 6,697,695 B1
(45) Date of Patent: Feb. 24, 2004

(54) LASER DEVICE MANAGEMENT SYSTEM

(75) Inventors: Takashi Kurihara, Kanagawa (JP); Shoichi Sakanishi, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 09/557,789

(22) Filed: Apr. 25, 2000

(51) Int. Cl.$^7$ .............................................. G06F 19/00
(52) U.S. Cl. ........................... 700/121; 700/9; 702/188
(58) Field of Search ........................... 700/9, 2, 3, 108, 700/121, 275; 702/188

(56) References Cited

U.S. PATENT DOCUMENTS

| | | | | |
|---|---|---|---|---|
| 5,243,377 A | * | 9/1993 | Umatate et al. | 355/53 |
| 5,463,650 A | * | 10/1995 | Ito et al. | 372/57 |
| 5,646,954 A | * | 7/1997 | Das et al. | 372/55 |
| 5,657,334 A | * | 8/1997 | Das et al. | 372/33 |
| 5,663,076 A | * | 9/1997 | Rostoker et al. | 438/14 |
| 5,710,787 A | * | 1/1998 | Amada et al. | 372/25 |
| 5,764,505 A | * | 6/1998 | Mixon et al. | 700/2 |
| 5,779,799 A | * | 7/1998 | Davis | 118/663 |
| 5,805,442 A | * | 9/1998 | Crater et al. | 700/9 |
| 5,991,324 A | * | 11/1999 | Knowles et al. | 372/57 |
| 6,008,497 A | * | 12/1999 | Mizoguchi et al. | 250/492.1 |
| 6,038,486 A | * | 3/2000 | Saitoh et al. | 700/9 |
| 6,061,603 A | * | 5/2000 | Papadopoulos et al. | 700/83 |
| 6,192,291 B1 | * | 2/2001 | Kwon | 700/121 |
| 6,199,018 B1 | * | 3/2001 | Quist et al. | 702/181 |
| 6,201,996 B1 | * | 3/2001 | Crater et al. | 700/9 |
| 6,233,492 B1 | * | 5/2001 | Nakamura et al. | 700/2 |
| 6,408,260 B1 | * | 6/2002 | Watts et al. | 702/188 |
| 6,522,674 B1 | * | 2/2003 | Niwano et al. | 372/30 |
| 6,564,171 B1 | * | 5/2003 | Peterson et al. | 702/183 |
| 2001/0020195 A1 | * | 9/2001 | Patel et al. | 700/121 |

FOREIGN PATENT DOCUMENTS

JP 7142801 2/1995

* cited by examiner

Primary Examiner—Ramesh Patel
Assistant Examiner—Edward F Gain
(74) Attorney, Agent, or Firm—Varndell & Varndell, PLLC

(57) ABSTRACT

A laser control apparatus that controls a laser device acquires state data from the laser device indicating the state of the laser device every time a specific preset event occurs, such as the generation of a fixed number of discharge pulses, for example, and transmits this data to a monitor terminal. The monitor terminal transfers the received state data to a server device via a communication channel. In the server device, a database is updated and output data is generated based on the transferred state data. This output data is input to a display terminal via a communication channel, and is displayed on the display terminal.

21 Claims, 27 Drawing Sheets

|  | EVENT | | DETAILS STORED |
|---|---|---|---|
| E1 | PLOT_L | EVERY 10M PULSES OSCILLATION | DATA INDICATING BEAM STATE |
| E2 | PLOT_S | EVERY 1M PULSES OSCILLATION | DATA INDICATING BEAM STATE |
| E3 | ERROR | ERROR/WARNING OCCURRENCE | ERROR CODE (*1), DATA INDICATING BEAM STATE |
| E4 | ERROR B | OPTICAL GRADE ABNORMALITY | ERROR CODE (*2), DATA INDICATING BEAM STATE |
| E5 | GASFILL | DURING GAS EXCHANGE | DATA INDICATING BEAM STATE |
| E6 | MNT | MODULE EXCHANGE, COUNTER RESET | MAINTENANCE DATA FOR EACH MODULE |
| E7 | STAT | CHANGE OF LASER OPERATING STATE | DATA INDICATING LASER CONTROL STATE |
| E8 | BEAM | LOG ACQUISITION REQUESTED FROM TERMINAL | HIGH VOLTAGE, WL, BW |
| E9 | WDIA | LOG ACQUISITION REQUESTED FROM TERMINAL | WAVELENGTH CONTROL DATA, MONITOR DATA |
| E10 | POWER | LOG ACQUISITION REQUESTED FROM TERMINAL | POWER SUPPLY MONITOR DATA |
| E11 | WLC | LOG ACQUISITION REQUESTED FROM TERMINAL | DATA INDICATING BEAM STATE (*3) |

FIG.3

APPARATUS ID #1

| EVENT | DETAILS STORED |
|---|---|
| PLOT_L | DATA INDICATING BEAM STATE AFTER EVERY 10M PULSES |
| PLOT_S | DATA INDICATING BEAM STATE AFTER EVERY 1M PULSES |
| ERROR | DATA CORRESPONDING TO ERROR DETAILS (ERROR CODE), DATA INDICATING BEAM STATE |
| ERROR B | DATA CORRESPONDING TO OPTICAL GRADE, ABNORMALITY DETAILS (ERROR CODE), DATA INDICATING BEAM STATE |
| GASFILL | DATA INDICATING BEAM STATE AFTER GAS EXCHANGE |
| MNT | MAINTENANCE DATA FOR EACH MODULE |
| STAT | DATA INDICATING LASER CONTROL STATE |
| BEAM | DATA INDICATING HIGH VOLTAGE USED TO GENERATE M PULSES, DATA INDICATING BEAM STATE |
| WDIA | WAVELENGTH CONTROL DATA, MONITOR DATA |
| POWER | POWER SOURCE MONITOR DATA FOR N BURSTS AFTER ISSUING LOG ACQUISITION REQUEST |
| WLC | DATA INDICATING BEAM STATE FOR N BURSTS AFTER ISSUING LOG ACQUISITION REQUEST |

110                                               120

APPARATUS ID #2

| EVENT | DETAILS STORED |
|---|---|
| PLOT_L | DATA INDICATING BEAM STATE AFTER EVERY 10M PULSES |
| ⋮ | ⋮ |
| WLC | DATA INDICATING BEAM STATE FOR N BURSTS AFTER ISSUING LOG ACQUISITION REQUEST |

110                                               120

APPARATUS ID #n

| EVENT | DETAILS STORED |
|---|---|
| PLOT_L | DATA INDICATING BEAM STATE AFTER EVERY 10M PULSES |
| ⋮ | ⋮ |
| WLC | DATA INDICATING BEAM STATE FOR N BURSTS AFTER ISSUING LOG ACQUISITION REQUEST |

LASER DEVICE MANAGEMENT SYSTEM

BACKGROUND OF THE INVENTION

1. Field of the Invention

The present invention relates to a laser device management system that remotely manages a laser device for an aligner or semiconductor fabrication apparatus wherein the operational status changes due to wear and the like of components during the running of the device.

2. Description of the Related Art

Hitherto, in laser devices such as excimer laser devices for aligners used in semiconductor fabrication apparatus situated in factories, the laser output characteristics may stray from desired characteristics due to changes of the operational status arising from wear and the like of components such as discharge electrodes. Consequently, for a maintenance worker at a remote location with respect to the factory, the maintenance of such devices has involved periodic trips to the factory to perform work such as replacing consumable components and adjusting the operating voltage setting according to the number of shots (number of laser oscillations).

Problems can also arise spontaneously in the laser device, and a maintenance worker also has to make a trip to the factory in such cases.

However, the conventional laser device of this sort has suffered from the following problems:

(1) When a problem has occurred spontaneously, it is impossible to procure resources such as replacement components and maintenance workers immediately, resulting in the semiconductor fabrication apparatus being left idle for long periods. Similarly, there have also been cases in which it is impossible to make an appropriate analysis of the problem based only on the limited data available at the factory site, causing the semiconductor fabrication apparatus to be left idle for long periods.

(2) Due to individual differences between components of the laser device such as the discharge electrode or the window, maintenance cannot always be performed accurately at the maintenance intervals preset during the design process. For example, a consumable component may have a lifetime close to the set lifetime, or its lifetime may become shorter than the set lifetime, depending on the operational status of the laser device. Consequently, it has hitherto been necessary to set the maintenance interval to a shorter period than the actual set lifetime to avoid the effects of the laser output characteristics, and when the lifetime of a consumable component becomes similar to a set lifetime, this consumable component must be replaced with a new component even if it is performing sufficiently well to continue to be used, making it impossible to use components (resources) efficiently.

(3) In laser devices, since the operating status changes due to the factors such as wear of the discharge electrode, it is necessary to reset the laser oscillation parameters depending on the operational status, but since the maintenance interval is long the laser is not always ideally tuned.

A device (system) that allows an operator in a remote location to operate and manage the laser device has also been implemented to solve the problem mentioned in (1) above.

A known device (system) of this sort is the laser device described in Japanese Patent Laid-open No. 7-142801.

In this laser device, an excimer laser oscillator connected to a communication network via an interface converter transmits the data the operator needs to know to remote management terminal equipment connected to the communication network, whereupon the terminal equipment displays the received data on a screen. By referring to the received data (the data the operator needs to know) displayed on the screen, the operator then collects and analyzes the internal data of the excimer laser oscillator (control variables such as the pressure inside the chamber).

Software for operational management is installed in a computer for use in operational management situated close to the excimer laser oscillator and in the computer used for the terminal equipment, and by running this software, the software functions can be used as the functions of a controller. In this way, the controller functions can be changed by changing the software contents without rewriting the program stored in ROM on the excimer laser oscillator.

However, the device described in the abovementioned publication suffers from the following problems:

(1) It is left down to the operator to analyze the internal data of the excimer laser oscillator based on the received data displayed on the screen, which is a troublesome task. In some cases it is possible that an incorrect analysis will be made, making it impossible to perform correct maintenance and management of the excimer laser oscillator.

(2) When changes are made to the software for operational management performed by the computer or terminal equipment, this software has to be reinstalled every time a new version comes out. In particular, when multiple items of computer or terminal equipment are present, the upgraded version of the software has to be re-installed on every item of equipment.

SUMMARY OF THE INVENTION

The present invention has been made in the light of these circumstances, and aims to provide a laser device management system wherein data indicating the state of the laser device is acquired by gathering data at predetermined events, thereby allowing it to predict the lifetime of consumable components and predict problems with the laser device before they occur, from a remote location.

The first invention of the present invention is therefore a laser device management system wherein a monitor terminal that monitors the state of an aligner that generates laser light, a server device having a database, and an output terminal having output means that outputs output data based on the contents of the database are connected via a communication channel, and wherein data communication is performed at least between the monitor and display terminals and the server device via the communication channel, in which laser device management system the monitor terminal comprises processing means which, when a preset event relating to the laser device has occurred, acquires state data from the laser device indicating the state of the laser device and transmits it to the server device, and wherein the server device comprises storage means that stores the state data transmitted from the processing means in the database, and generation means that generates output data based on the contents of the database and transmits it to the output terminal.

The first invention is described with reference to FIG. 12.

Laser control apparatus 10, 10A acquires data indicating the state of the laser device (referred to here as maintenance data) every time one of the specific events shown below occurs, for example.

These specific events include the following:

(1) Passage of a fixed amount of time, operation for a fixed amount of time, generation of a fixed number of discharge pulses.

(2) Occurrence of an error or warning.

(3) Completion of maintenance work (operation record), completion of a periodic operation peculiar to the laser device, such as gas exchange.

When one of the abovementioned specific events has occurred, laser control apparatus 10, 10A transmits maintenance data, comprising an apparatus ID and the maintenance data, to a monitor terminal 20 via LAN 80 (process P81).

Monitor terminal 20 transmits the received maintenance data to server device 30 via network 50 (process P3, P4)

In server device 30, a database 33 is updated by database updating function 212 based on the received data (i.e. maintenance data) (process P5). At this time, the maintenance data is updated for each apparatus ID.

When the database has been updated, server device 30 also uses a display data preparation and communication function 213 to prepare display data to be output to display terminal 40 based on the updated database (process P6), and uses the display data preparation and communication function 213 to transmit this prepared display data to display terminal 40 via network 50 (process P7, P8).

In display terminal 40, the received display data is displayed by display device 45 (process P9).

As described above, with the first invention, maintenance data is transmitted to and stored in server device 30 every time a specific event occurs, such as the passage of a fixed amount of time or the generation of a fixed number of discharge pulses for example, and is also displayed on display terminal 40. Accordingly it is possible to periodically accumulate data on data indicating the state of the laser device even at a remote location, allowing the state of the laser device to be ascertained periodically and accurately.

The second invention comprises a monitor terminal and a display terminal which are connected to a communication channel to which are connected a server device having a database that stores state data indicating the state of a laser device transmitted from a transmitting device and generating means that generates output data based on the contents of the database and transmits it to another device, and which perform data communication with the server device via this communication channel, wherein the monitor terminal comprises processing means which, when a preset event relating to an aligner that generates laser light has occurred, acquires state data indicating the state of the laser device from the laser device and ,transmits it to the communication channel, and wherein the display terminal comprises output means that outputs output data based on the contents of the database from the server device received via the communication channel.

Since this second invention is an invention that approaches the first invention from a different viewpoint, it involves performing a process similar to that of the first invention. Accordingly, the second invention can also obtain similar effects and advantages to those of the first invention.

In the third invention, generation means of the server device in the first or second invention diagnoses the state of the laser device based on the parts of the state data stored in the database that correspond to the state data obtained a fixed time beforehand, generates output data indicating the result of the abovementioned diagnosis, and transmits it to the output terminal.

In the fourth invention, generation means of the server device in the first or second invention diagnoses the state of the laser device based on the most recent state data stored in the database and on preset diagnosis criteria, generates output data indicating the result of the diagnosis, and transmits it to the output terminal.

In the fifth invention, when the laser device is a gas laser device, processing means of the monitor terminal in the first or second invention acquires state data in the form of data indicating the number of discharge pulses in the gas laser device, and transmits it to the server device, and the generation means of the server device predicts errors in the state of the gas laser device based on data indicating the most recent number of discharge pulses stored in the database, generates output data indicating the result of this prediction, and transmits it to the output terminal.

In the sixth invention, when the laser device is a gas laser device that generates laser light with a gas laser, processing means of the monitor terminal in the first or second invention acquires the state data in the form of data indicating the operational status—including the number of discharge pulses—of the gas laser device that affects the lifetime of components used in the gas laser device, and transmits it to the server device, and generation means of the server device predicts the lifetime of the components based on the state data stored in the database, generates output data indicating the result of this prediction, and transmits it to the output terminal.

The third through sixth inventions are described with reference to FIG. 14.

When an event occurs, the laser control apparatus (not illustrated) acquires maintenance data relating to the laser device and transfers it to monitor and display terminal 90 via LAN 80.

When monitor and display terminal 90 receives the maintenance data comprising the apparatus ID and maintenance data transmitted from the laser control apparatus, it transfers this maintenance data to server device 30 via network 50 (process P301, P302).

In server device 30, when the maintenance data transferred via network 50 is received, database 33 is updated based on this maintenance data by database updating function 212 (process P303), and the state of the laser device is diagnosed by device status judgement function 223 based on the maintenance data stored in database 33 (step P304).

Next, server device 30 uses a warning notification function 224 to notify monitor and display terminal 90 via network 50 of the laser device status in the form warning data based on the results of judgement made by device status judgement function 223 (process P305, P306).

In monitor and display terminal 90, when the transferred warning data from server device 30 is received via network 50, the warning details are displayed on the display device based on this received warning data by executing a display terminal communication and display program 222.

In this way, a user such as a maintenance worker for example is able to discover any problems in the laser device at an early stage based on the displayed warning details while referring to the display device of monitor and display terminal 90, and can perform the prescribed maintenance work.

Since there are various ways in which the state of the laser device can be judged by device status judgement function 223, these judgement methods are described here.

(1) The maintenance data is compared with preset judgement criteria, and the status of the laser device is judged according to the results of this comparison. For example, it might compare the number of pulses with a judgement criterion such as "number of discharge (or oscillation) pulses" included in the maintenance data, and when the number of discharge (or oscillation) pulses has exceeded the judgement criterion value, or when the number of discharge (or oscillation) pulses has reached, say, 70% or 80% of the judgement criterion value, this fact is treated as the judgement result.

Some specific judgement examples are shown below.

(A) Judging when "the operating time of a consumable component or the number of discharge (or oscillation) pulses has exceeded or is close to a stipulated value".

This judgement involves predicting the lifetime of consumable components, and identifying consumable components that have reached the end of their lifetime and need to be replaced when the actual value exceeds the stipulated value, or consumable components that will soon reach the end of their lifetime when the actual value is close to the stipulated value. However, since the maintenance data is gathered periodically, it is possible to ascertain that a consumable component will soon reach the end of its lifetime before the actual value exceeds the stipulated value, allowing measures to be taken at an early stage.

(B) Judging when "the device operating time or the number of discharge (or oscillation) pulses has exceeded or is close to a stipulated periodic maintenance interval".

(2) Based on the "number of discharge (or oscillation) pulses" included in the maintenance data stored according to events produced during a fixed period in the past, obtain the time-series variation, i.e. a graph illustrating the characteristics of the number of discharge pulses with respect to time (period), and judge the state of the laser device based on the slope of this characteristic graph. When the slope of this characteristic graph exceeds a preset gradient ratio, or when the slope of this graph is less than a preset gradient ratio, this fact is treated as the judgement result.

A specific judgement example is shown below.

(A) Judging when "the variation of a value associated with light quality, such as the laser light wavelength or the discharge voltage, has exceeded or is close to a stipulated value".

In this case, the characteristic graph could be output as long-term trend data instead of being used to make judgements.

As described above, with the third and fourth inventions, it is possible to diagnose the state of this laser device based on data indicating the state of the laser device produced at each event. Also, with the fifth invention, it is possible to predict problems in the state of the laser device. Furthermore, with the sixth invention, it is possible to predict the lifetime of components.

In the seventh invention, the server device in the first or second invention further comprises storage means that stores a first program that executes a prescribed process to be implemented by the monitor terminal, and a second program that executes a prescribed process to be implemented by the display terminal, and program transmission means that transmits the first program to the monitor terminal or transmits the second program to the output terminal according to a transmission request from the monitor terminal or the display terminal, and the monitor terminal further comprises first execution means that executes a first program transmitted by the program transmission means, and the output terminal further comprises second execution means that executes a second program transmitted by the program transmission means.

The seventh invention is described with reference to FIG. 20.

When the person responsible for managing the server device has upgraded the program in server device 30 that is executed by the laser control apparatus, for example, the properties (format, number of items) of the data stored thereby and the data shown by the analysis method are updated in accordance with the details of the change, and monitor terminal program 252A and display terminal program 252B are updated.

Server device 30 then transmits a message to the effect that the program has been upgraded to the display terminal or monitor terminal.

For example, based on the "message to the effect that the display terminal program has been upgraded" displayed on the screen of the display device, display terminal 40 inputs data necessary for user authorization such as a user ID and password, and a message to the effect that this program will be downloaded.

This data is transmitted to server device 30 via network 50, whereby server device 30 transmits the upgraded display terminal program 252B to the display terminal corresponding to the received user ID and password.

In display terminal 40, the received upgraded display terminal program 252B is downloaded into external storage device 43, and the downloaded display terminal program 252B is executed by distribution program execution function 253, whereby it is possible to display the display data based on the execution of the upgraded display terminal program 252B.

As described above, with the seventh invention even, when the laser device control software is changed the corresponding parts of the program for the display terminal or monitor terminal are altered at the serves device, and the corresponding upgraded program can be downloaded by the terminals concerned, and thus no changes have to be made to the programs at each terminal.

In the eighth invention, the output terminal in the first or second invention further comprises first transmission means that transmits the values of parameters affecting the output characteristics of the laser device to the server device, the server device further comprises second transmission means that transmits the parameters from the first transmission means to the monitor terminal, and the monitor terminal further comprises transfer means that transfers the parameters from the second transmission means to the laser device.

The eighth invention is described below with reference to FIG. 21.

For example, by monitoring the display details displayed by display terminal 40, the maintenance worker is made aware of any changes to the operational status of the laser device, and operates input device 46 to input the apparatus ID of this laser device and update the parameter values of this laser device to obtain a fixed discharge energy by issuing a parameter modification request. The parameters modified at this time are device parameters 264B.

These device parameters 264B and the apparatus ID are input to server device 30 via network 50.

On doing so, a program and parameter distribution function 264 is executed in server device 30 to distribute the device parameters 264B, whereby the received device parameters 264B and apparatus ID are transmitted to the monitor terminal (e.g. monitor terminal 20) that manages the laser control apparatus that controls the laser device indicated by this apparatus ID.

Monitor terminal 20 transfers the received device parameters 264B to the laser control apparatus (e.g. laser control apparatus 10) that controls the laser device indicated by the received apparatus ID.

This laser control apparatus 10 loads a program for executing program and parameter download function 261 into memory 17A from external storage device 17B and executes it, whereby the transferred device parameters 264B are downloaded.

As described above, with the eighth invention, programs for controlling the laser device and parameter maintenance operations can also be executed from a remote location, whereby the efficiency of laser device maintenance operations can be improved.

In the ninth invention, the passage of a fixed amount of time constitutes an event in the first or second invention.

In the tenth invention, operation for a fixed amount of time constitutes an event in the first or second invention.

In the eleventh invention, a fixed number of discharge pulses constitutes an event in the first or second invention.

In the twelfth invention, the occurrence of an error constitutes an event in the first or second invention.

In the thirteenth invention, a warning constitutes an event in the first or second invention.

In the fourteenth invention, an operation record after implementing maintenance work constitutes an event in the first or second invention.

In the fifteenth invention, the completion of a periodic operation inherent to the laser device constitutes an event in the first or second invention.

In the sixteenth invention, a manual log acquisition command constitutes an event in the first or second invention.

In the seventeenth invention, a command for remote log acquisition by communication constitutes an event in the first or second invention.

In the ninth through seventeenth inventions, data is gathered from data indicating the laser device state at each of the preset events described therein. Consequently, since data is periodically gathered from data indicating the laser device state at these events, the state of this laser device can be quickly ascertained.

BRIEF DESCRIPTION OF THE DRAWINGS

FIG. 3 is a view illustrating the events in the laser device;

FIG. 6 is a view illustrating an example of a database stored in server device 30;

DESCRIPTION OF THE PREFERRED EMBODIMENTS

Embodiments of the present invention are described below.

Figure 1:
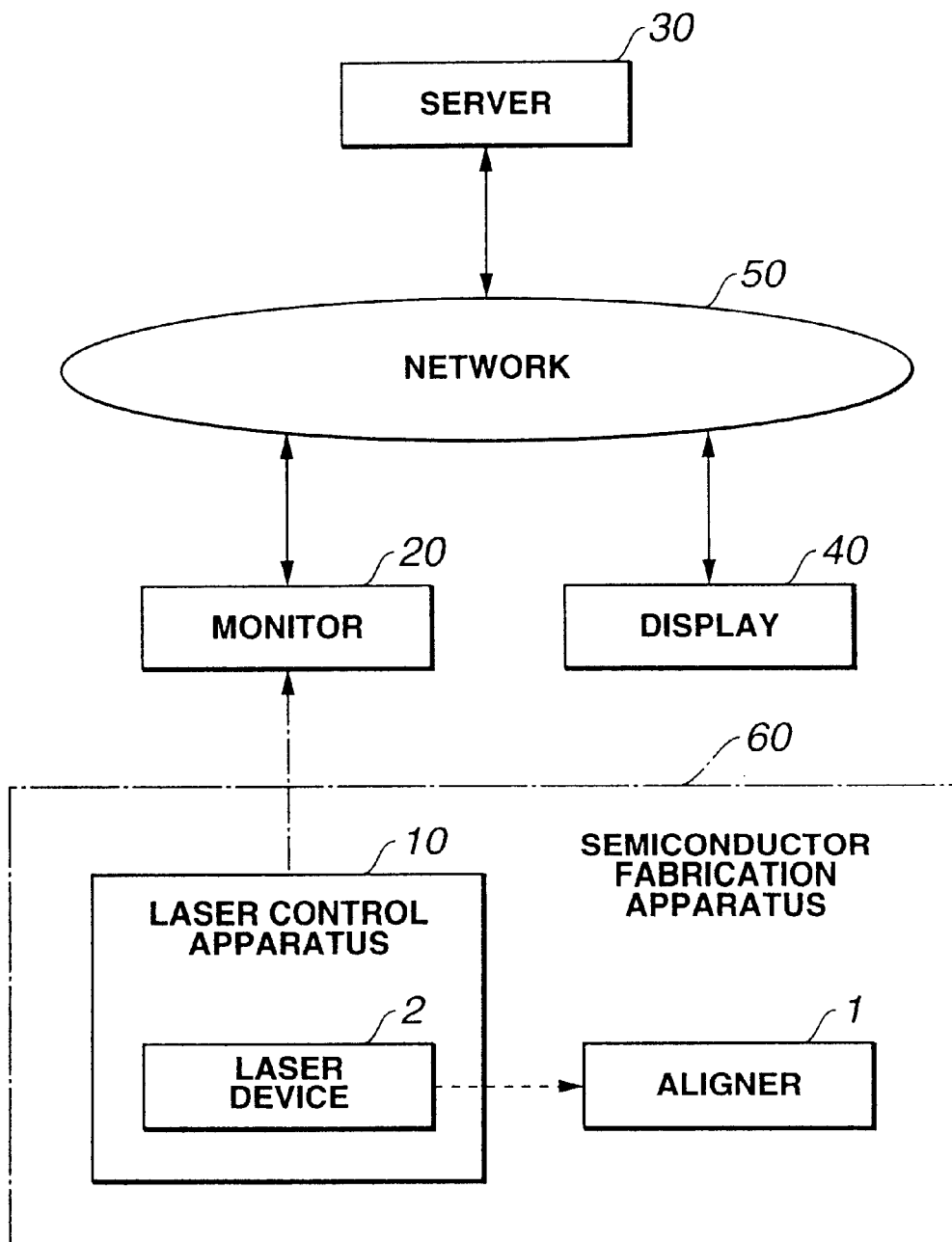
FIG. 1 is a block diagram illustrating the configuration of a laser device management system relating to a first embodiment of the present invention.

FIG. 1 is a block diagram illustrating the configuration of a laser device management system relating to the present invention.

This laser device management system consists of a laser control apparatus 10 which controls a laser device 2 that is the exposure light source of aligner 1 and acquires data indicating the state of laser device 2 at each event from this laser device, a monitor terminal 20 which transfers the data indicating the state of laser device 2 acquired by laser control apparatus 10 to a server device 30, a server device 30 which stores the received data in a database and processes and outputs it, and a display terminal 40 which displays the device state. These parts are connected together via a network 50. Here, a semiconductor fabrication apparatus 60 is configured by aligner 1 and laser control apparatus 10.

Although only one monitor terminal 20 is shown in FIG. 1, it is also possible to have a plurality of monitor terminals connected to network 50. Also, although monitor terminal 20 monitors just one semiconductor fabrication apparatus (or laser device), it could also be used to monitor a plurality of semiconductor devices. In this case, the plurality of semiconductor fabrication apparatus could be situated at a single factory, or they could be distributed among a plurality of factories.

Since display terminal 40 is assumed to be a remote maintenance and management terminal, a maintenance worker is disposed at the same location. Accordingly, although it does not have to be situated close to semiconductor fabrication apparatus 60, display terminal 40 is preferably situated in a place where it can be subjected to maintenance and inspection within a fixed period (within a fixed time).

Here, monitor terminal 20, server device 30, display terminal 40 and semiconductor fabrication apparatus 60 do not have to exist at the same location (or even in the same country).

For example, server device 30 might be situated in country A while monitor terminal 20, display terminal 40 and semiconductor fabrication apparatus 60 are situated in country B. Each of the abovementioned constituent elements could also be situated in different states.

Network 50 is assumed to be a public circuit such as a telephone circuit or ISDN (integrated services digital network). A private circuit could also be used. Ways in which this network 50 could be used include internet, intranet or facsimile (FAX). When network 50 is used as an internet, the data communication is performed according to a communication protocol based on the OSI reference model, such as TCP/IP for example.

Figure 2:
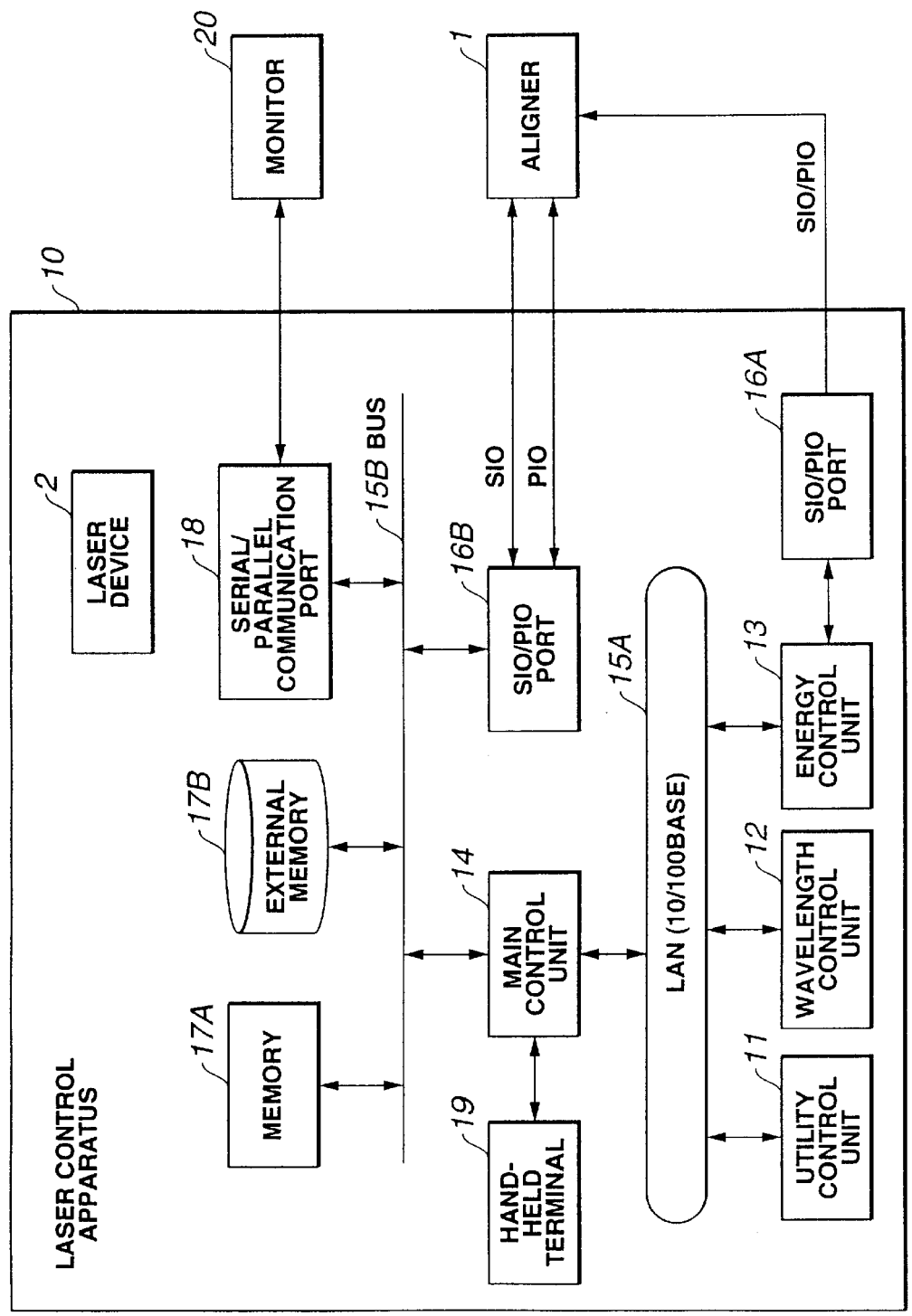
FIG. 2 is a block diagram illustrating the configuration of laser control apparatus 10 in the first embodiment.

FIG. 2 is a detailed block diagram of laser control apparatus 10.

In laser control apparatus 10, a utility control unit 11, a wavelength control unit 12, an energy control unit 13 and a main control unit 14 are connected to a local area network (abbreviated to LAN in the following) 15A. LAN 15A is, for example, configured as an ethernet network using 10 BASE cable and/or 100 BASE cable.

Energy control unit 13 is connected to aligner 1 via a serial input/output (abbreviated to SIO in the following) port or parallel input/output (abbreviated to PIO in the following) port 16A.

Main control unit 14, memory 17A, external storage device 17B, SIO or PIO port (abbreviated to SIO/PIO port in the following) 16B and serial communication port or parallel communication port (abbreviated to serial/parallel communication port in the following) 18 are connected to a bus 15B.

Furthermore, main control unit 14 and hand-held terminal 19 are connected by, for example, a radio communication channel.

Utility control unit 11 controls the discharge gas pressure, manages the cooling water and ventilation fan, and monitors the following monitored items.

The monitored items might include, for example, the discharge gas pressure, the supply gas pressure, a gas leak check, the temperature of the cooling water, the flow rate of the cooling water, and the flow rate of the ventilation fan. The supply gas pressure is monitored for each gas, examples of which may include fluorine ($F_2$) gas, a mixture of krypton (Kr) and neon (Ne), helium (He) gas, nitrogen ($N_2$) gas and argon (Ar) gas.

Wavelength control unit 12 measures and controls the wavelength and spectral line width of the laser light. Specifically, it acquires monitor results from a monitor module that measures the wavelength and spectral line width of the laser light, and performs control according to these monitor results so that the wavelength and spectral line width of the laser light reach the prescribed values.

Based on data indicating the high voltage output from aligner 1 which is input via SIO/PIO port 16A, energy control unit 13 controls the discharge energy and discharge timing (triggering) and performs high voltage management such as starting up, stopping, and setting command values to the high voltage power source. It also monitors the following monitored items.

The monitored items are, for example, sensing the discharge energy, sensing incorrect discharge (oscillation), counting the number of discharge (oscillation) pulses, the high voltage, the energy distribution (average, σ) and the state of the high voltage power supply.

The utility control unit 11, wavelength control unit 12 and energy control unit 13 acquire data indicating the monitored results from their corresponding control unit when a preset event has occurred with regard to semiconductor fabrication apparatus 60 or laser device 2.

This data is data indicating the state of semiconductor fabrication apparatus 60 or laser device 2 (referred to as state data in the following), and is also data for the maintenance of these devices (referred to as maintenance data in the following).

Therefore, in the following description, the "state data" is referred to as "maintenance data". Details of this maintenance data are described later.

Hand-held terminal 19 functions as an input interface; for example, it issues commands such as commands for the acquisition of maintenance data, parameter setting, and referral to the laser state. The maintenance data acquisition commands are described in detail later, but they consist of commands used when an event relating to laser device 2 is generated and commands for manual log acquisition.

External storage device 17B stores a program which indicates a processing procedure needed by main control unit 14 to perform data processing, and data needed by main control unit 14 to acquire maintenance data relating to laser device 10. External storage device 17B has a storage means such as a magnetic disk, optical disk or floppy disk.

Memory 17A includes a region in which a program loaded from external storage device 17B is stored, and a region needed by main control unit 14 to process data (e.g. a work area).

Serial/parallel communication port 18 is a port for performing data communication with monitor terminal 20 by way of serial or parallel transmission. An example of a transmission medium whereby this data communication can be performed is an ethernet network using 10 BASE cable and/or 100 BASE cable.

Main control unit 14 monitors the state of aligner 1 (laser device) by performing data communication with this aligner 1 via SIO/PIO part 16B which has an SIO part and an PIO part. That is, main control unit 14 implements laser operation, maintenance management, log processing and error processing. Main control unit 14 also performs program management and parameter management.

Furthermore, main control unit 14 acquires maintenance data from each of the control units and transmits event data to monitor terminal 20. Specifically, it performs the following processing:

(1) Request the acquisition of event data from the control unit concerned based on a maintenance data acquisition command from hand-held terminal 19.

(2) Associate device identification data (referred to as apparatus ID in the following) indicating the laser device being monitored with the maintenance data transmitted from utility control unit 11, wavelength control unit 12 and energy control unit 13, which is input via LAN 15A, store it in memory 17A, and if necessary store it in external storage device 17B.

(3) Transmit the maintenance data and apparatus ID to monitor terminal 20 via serial/parallel communication port 18.

Here, the maintenance data is described in detail.

This maintenance data includes data indicating the operational status, quality data, data indicating the operational status of maintained components, and data indicating the error history.

The data indicating the operational status includes data indicating the number of discharge (or oscillation) pulses, and the operating time and length of service of the laser device.

The quality data includes data indicating the optical grade, discharge voltage and laser optical wavelength.

The data indicating the operational status of maintained components includes data indicating the number of discharge (or oscillation) pulses after the replacement of maintained components, and the operating time of the laser device.

Maintenance data of this sort is acquired by laser control apparatus 10 every time a preset event occurs, such as the maintenance data acquisition command from the operator or a specific event.

Here, a specific event can include any of the following:
(1) Passage of a fixed amount of time, operation for a fixed amount of time, generation of a fixed number of discharge pulses.
(2) Occurrence of an error or warning.
(3) Completion of maintenance work (operation record), completion of a periodic operation peculiar to the laser device, such as gas exchange.

On the other hand, the maintenance data acquisition command encompasses "BEAM", "WDIA", "POWER" and "WLC" commands.

A "BEAM" command is used when laser control apparatus 10 is made to acquire data indicating the high voltage, the discharge energy and the beam state (the laser wavelength and laser spectral line width) as the maintenance data.

A "WDIA" command is used when laser control apparatus 10 is made to acquire wavelength control data and monitor data, which is the output of the monitor module, as the maintenance data.

A "POWER" command is used when laser control apparatus 10 is made to acquire data indicating the monitor state of the power source (discharge voltage, discharge energy) for n bursts as the maintenance data.

A "WLC" command is used when laser control apparatus 10 is made to acquire data indicating the beam state (laser light wavelength, laser light spectral line width) for n bursts as the maintenance data.

Here, FIG. 3 shows an example of the maintenance data corresponding to events that is acquired by laser control apparatus 10 and stored in memory 17A.

In FIG. 3, reference numeral 71 indicates the event, reference numeral 71A indicates the event name, and reference numeral 71B indicates the event details. Reference numeral 72 indicates the maintenance data for each event.

In this embodiment, maintenance data is stored in memory 17A corresponding to 11 events as indicated by reference numerals E1 through E11.

Here, the data indicating the beam state in lines E1 through 5 indicates the gas pressure, the laser light wavelength and the laser light spectral line width.

The error code (*1) in line E3 indicates data corresponding to the error details.

The error code (*2) in line E4 indicates data corresponding to the abnormal details of the optical grade.

The maintenance data for each module in line E6 indicates the number of pulses and the time since the consumable component was replaced.

The data indicating the laser control state in line E7 indicates whether the laser control state was changed to manual or to operation in conjunction with the aligner.

In line E8, WL indicates the wavelength of the laser light, and BW indicates the spectral line width of the laser light.

The wavelength control data in line E9 indicates control parameters for keeping the wavelength of the laser light constant, and the monitor data indicates the monitor results (monitor data) from the monitor module that measures the wavelength of the laser light.

The power supply monitor data in line E10 indicates the discharge voltage and discharge energy for n bursts after a request was issued.

The data (*3) indicating the beam state in line E 11 indicates the wavelength of the laser light and the spectral line width of the laser light for n bursts after a request was issued.

The log acquisition requested from the terminal in lines E8 through 11 refers to the operation of inputting a maintenance data acquisition command with hand-held terminal 19.

Note that the maintenance data is combined with an apparatus ID (to form a pair), and is subjected to data processing such as storage in memory and data communication. Therefore, in the following description, the "maintenance data" is referred to as "maintenance data", and "this combination of maintenance data and apparatus ID" is referred to as new "maintenance data". Accordingly, the maintenance data is assumed to include an apparatus ID, and when necessary it is also taken to include the apparatus ID into its scope.

In the details defined here, the maintenance data is only subjected to data communication between laser control apparatus 10 and monitor terminal 20, whereas the maintenance data is subjected to data communication between monitor terminal 20 and server device 30, and between server device 30 and display terminal 40 as described below, so there is no confusion between the terms.

Figure 4:
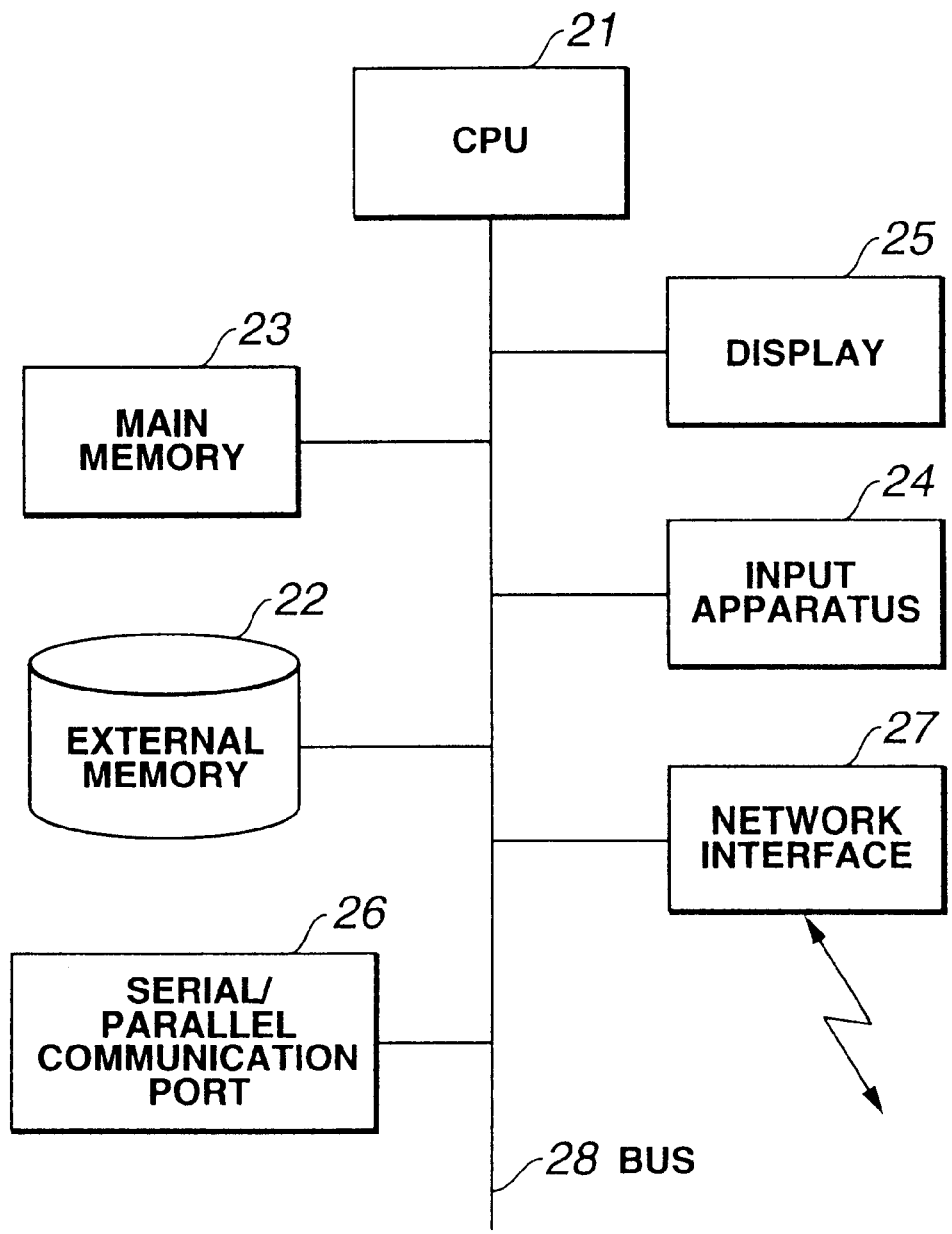
FIG. 4 is a block diagram illustrating the configuration of monitor terminal 20 in the first embodiment.

FIG. 4 is a detailed block diagram illustrating the configuration of monitor terminal 20.

Monitor terminal 20 is configured from a computer such as a personal computer, and as shown in FIG. 4 it includes a central processing unit (referred to as CPU in the following) 21, an external storage device 22, a main memory 23, an input device 24, a display device 25, a serial/parallel communication port 26 and a network interface (referred to as network IF in the following) 27, which are connected together via a bus 28.

External storage device 22 consists of a storage means such as a magnetic disk, optical disk or floppy disk, and stores various programs, including a program that indicates the processing procedure whereby CPU 21 acquires maintenance data, along with any necessary maintenance data.

Main memory 23 consists of a storage means such as a RAM, and is used to store programs loaded from external storage device 22 and various types of data such as maintenance data acquired by CPU 21.

Input device 24 consists of an input means such as a keyboard and/or mouse, and is used to issue various types of instruction, including the starting up of specific programs.

Display device 25 consists of a display means such as a display unit, and displays prescribed display data. It can of course also be used to display maintenance data.

Serial/parallel communication port 26 performs data transmission and reception by a serial or parallel transmission method with laser control apparatus 10. Incidentally, the data communication with laser control apparatus 10 is performed via, for example, an ethernet network using 10 BASE cable and/or 100 BASE cable.

Network IF 27 performs data transmission and reception with server device 30 via network 50 according to a prescribed communication protocol.

CPU 21 controls each of the constituent elements 22 through 27 via a bus 28. For example, every time an event is generated, CPU 21 stores the maintenance data (including an apparatus ID) from laser control apparatus 10 that has been input via serial/parallel communication port 26 in main memory 23 and transmits it to server device 30 via network IF 27.

Figure 5:
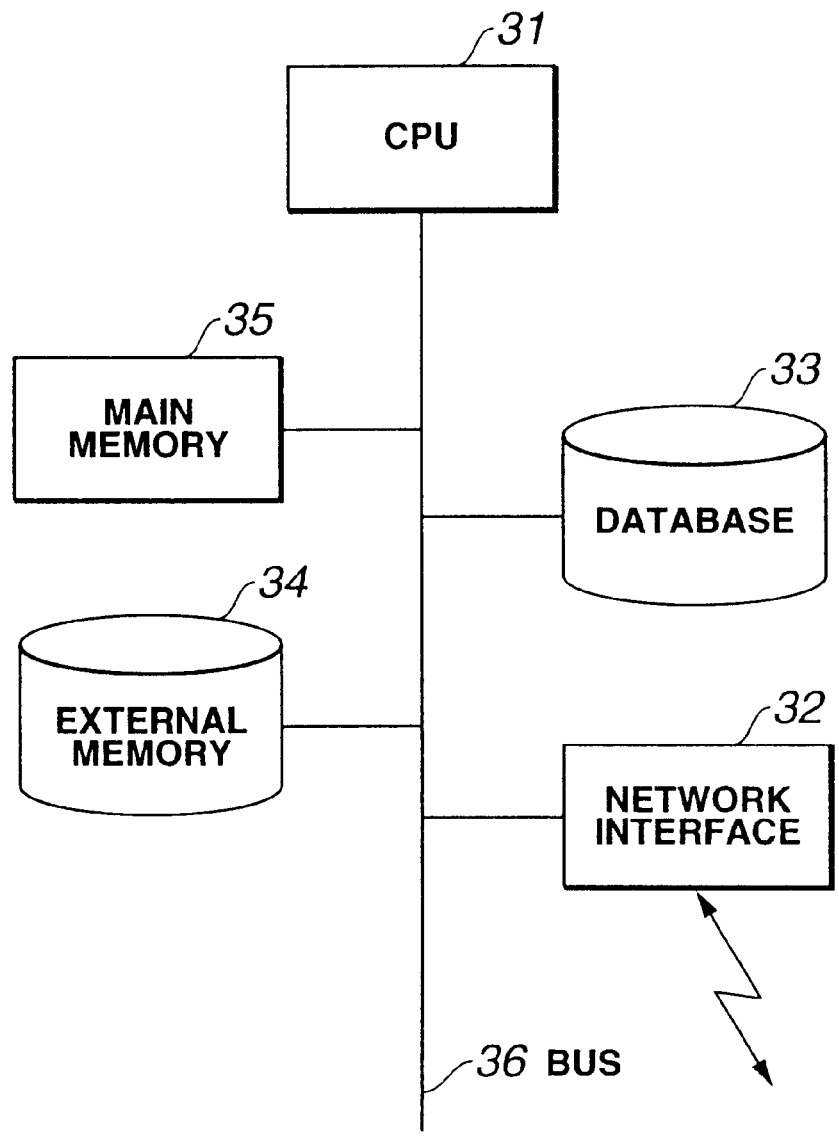
FIG. 5 is a block diagram illustrating the configuration of server device 30 in the first embodiment.

FIG. 5 is a detailed block diagram of server device 30.

Server device 30 consists of a computer, and as shown in FIG. 5, it includes a CPU 31, a network IF 32, a database 33, an external storage device 34 and a main memory 35, which are connected together via a bus 36.

Network IF 32 transmits and receives data between monitor terminal 20 and display terminal 40 according to a prescribed communication protocol.

Database 33 stores the maintenance data input through network IF 32. The contents of this database 33 are described later.

External storage device 34 stores a program indicating the processing procedure for each type of data processing, including a processing procedure for updating the contents of database 33 and a processing procedure for generating output data based on the contents of database 33, for example.

Main memory 35 consists of a storage means such as a RAM, and is equipped with a memory region that stores a program loaded from external storage device 34 and a memory region that is needed by CPU 31 when performing data processing, such as generating output data.

CPU 31 controls each of the constituent elements 32 through 35 via a bus 36. For example, CPU 31 associates an ID for the device concerned with the maintenance data in the maintenance data from monitor terminal 20 input via network IF 32, stores it in database 33, and transmits this maintenance data to display terminal 40 via network IF 32. Also, CPU 31 generates output data by processing data based on the contents of database 33, and transmits this generated output data to display terminal 40 via network IF 32.

Here, an example of the contents of database 33 is shown in FIG. 6.

In database 33, as shown in FIG. 6, maintenance data is stored for each apparatus ID of a plurality of apparatus IDs #1 through #n.

In FIG. 6, the items indicated by reference numeral 110 are events, corresponding to the event items 71 in FIG. 3 mentioned above, and the items indicated by reference numeral 120 are the maintenance data for each event (data indicating the laser device state), corresponding to the stored contents of items 72 in FIG. 3 mentioned above. The stored contents of items 72 in FIG. 3 mentioned above and the stored contents of items 120 in FIG. 6 are made consistent with each other.

Figure 7:
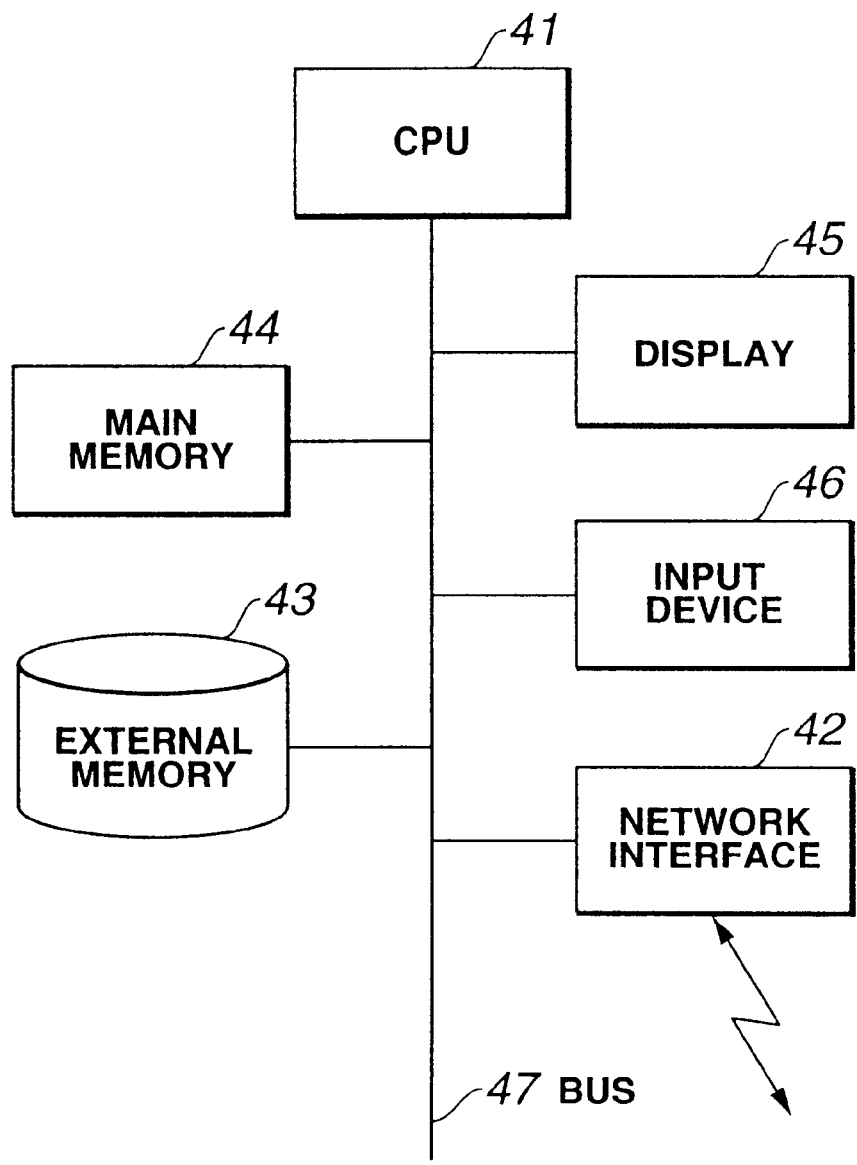
FIG. 7 is a block diagram illustrating the configuration of display terminal 40 in the first embodiment.

FIG. 7 is a detailed block diagram of display terminal 40.

Display terminal 20 consists of a computer such as a personal computer, and as shown in FIG. 7 it includes a CPU 41, a network IF 42, an external storage device 43, a main memory 44, a display device 45 and an input device 46 which are connected together via a bus 47.

Network IF 42 transmits and receives data with server device 30 via network 50 according to a prescribed communication protocol.

External storage device 43 stores various programs including a program that indicates a processing procedure for displaying the maintenance data on display device 45.

Main memory 44 consists of a storage means such as a RAM, and stores the data (maintenance data) output from server device 30 input via network IF 42, data such as commands input from input device 46, and programs loaded from external storage device 43.

Display device 45 consists of a display means such as a display unit, and displays the output data transmitted from server device 30. Here, since the case is considered where output data from server device 30 is displayed on display device 45, the output data is referred to as display data in the following description.

Input device 46 consists of an input means such as a keyboard and/or mouse, and is used to issue various types of instruction, including the starting up of specific programs.

CPU 41 controls each of the constituent elements 42 through 46 via a bus 47. For example, CPU 41 stores the display data from server device 30 input via network IF 42 in main memory 23 and displays it on display device 45.

Incidentally, since the data communication via network 50 is performed according to a communication protocol conforming to the OSI reference model, such as the TCP/IP communication protocol for example, the network IF 27 of monitor terminal 20, network IF 32 of server device 30 and network IF 42 of display terminal 40 are made capable of data communication according to the TCP/IP communication protocol.

Note that when network 50 is a telephone circuit, it is necessary to use a modem comprising a communication control unit (CCU) and a network control unit (NCU) for each of the network IFs.

Figure 8:
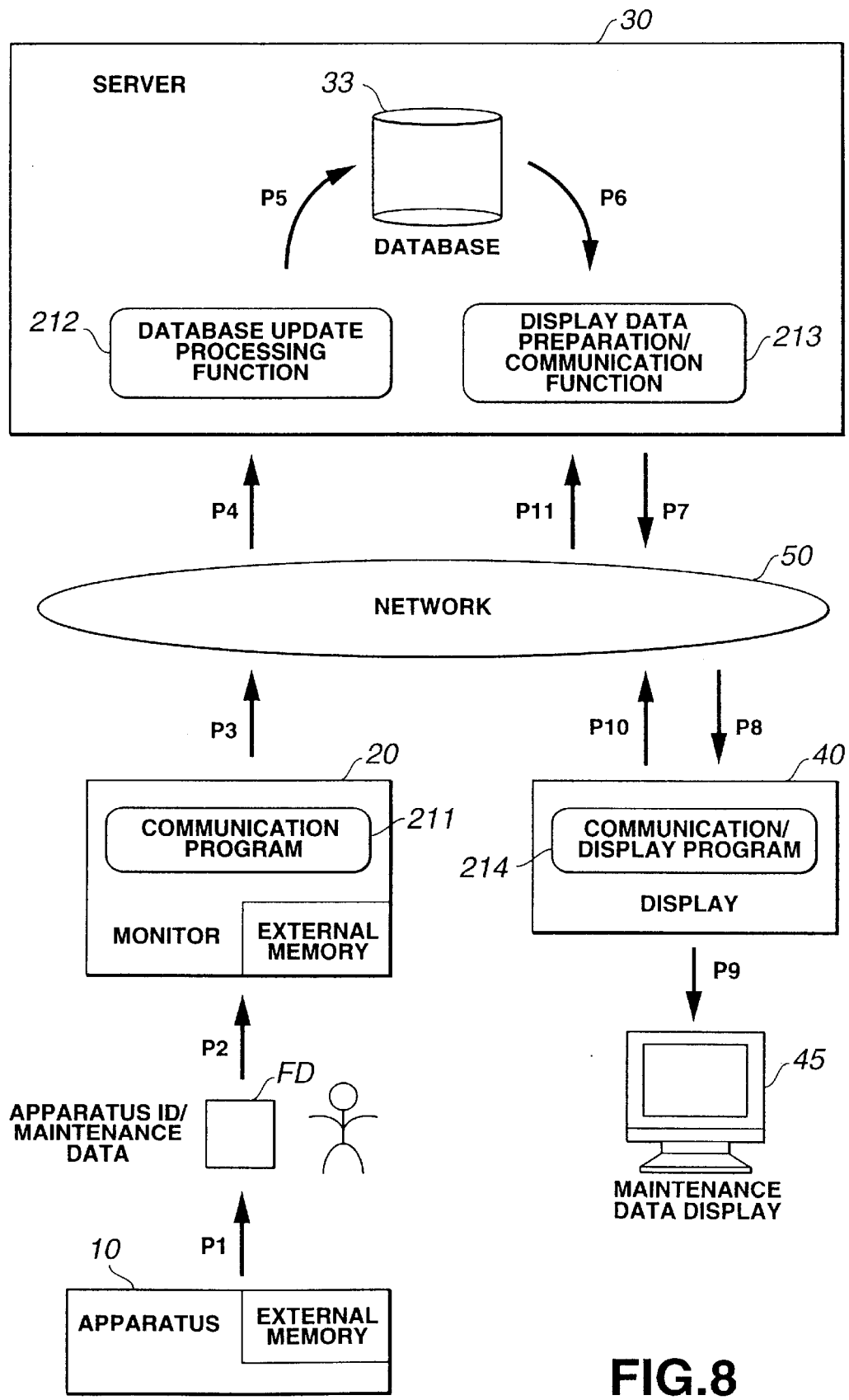
FIG. 8 is a view illustrating a functional representation of a laser device management system relating to the first embodiment.
Figure 9:
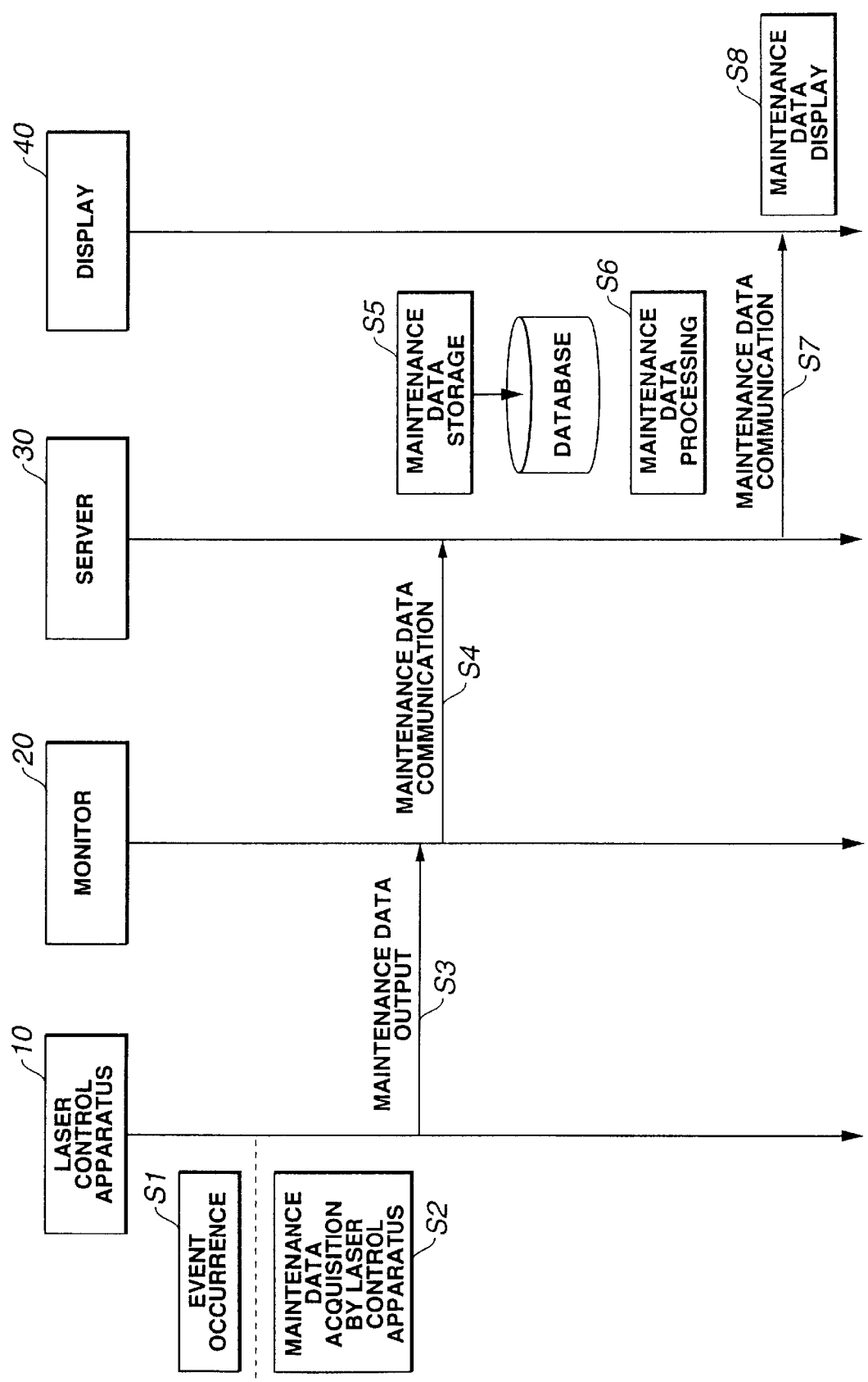
FIG. 9 is a sequence diagram illustrating the data communication processing operations in a laser device management system relating to the first embodiment.

Next, the display of maintenance data in the laser device management system is described with reference to. FIGS. 8 and 9.

FIG. 8 shows a functional representation of a laser device management system, and FIG. 9 is a sequence diagram illustrating the processing operations of the laser device management system.

Here, the case is assumed where processing is performed under the following conditions.

It is assumed that laser control apparatus 10 and monitor terminal 20 are connected by a communication channel such as a LAN.

Monitor terminal 20 loads a communication program 211 from external storage device 22 into main memory 23 and runs it.

Server device 30 loads programs for respectively implementing a database updating function 212 and display data preparation and communication function 213 into main memory 35 from external storage device 34 and runs them.

Display terminal 40 load a communication and display program 214 into main memory 44 from external storage device 43 and runs it.

The person using display terminal 40 is assumed to be someone who requires maintenance data on laser control apparatus 10, such as a maintenance worker.

When a preset event has occurred, such as gas exchange or the generation of an alarm and an unscheduled shutdown of semiconductor fabrication apparatus 60 (see S1 in FIG. 9), utility control unit 11, wavelength control unit 12 and energy control unit 13 in laser control apparatus 10 acquire maintenance data in the form of data indicating the monitor results of their own control units, and transmit it to main control unit 14 via LAN 15A.

Main control unit 14 associates the received maintenance data with the apparatus ID of the monitored laser device, and stores it in memory 17A as maintenance data (see S2 in FIG. 9).

The operator operates hand-held terminal 19 to issue a maintenance data acquisition command to laser control apparatus 10 at every predetermined event (e.g. every gas exchange) or when semiconductor fabrication apparatus 60 is subjected to an unscheduled shutdown. Specifically, a command is input to acquire maintenance data either for all of the events E1 through E11 shown in FIG. 3, or for any desired events.

As shown in FIG. 8, laser control apparatus 10 writes the maintenance data stored in memory 17A to an external storage medium such as a floppy disk (FD) based on a given command (process P1).

Next, the operator inserts the external storage medium on which the maintenance data was written in process P1 above into an external storage device 22 in laser control apparatus 10 (process P2) (see S3 in FIG. 9), after which the input device 24 of laser control apparatus 10 is operated to activate the data acquisition program.

CPU 21 reads in the maintenance data into the main memory 23 from the external storage medium inserted into external storage device 22 by executing the data acquisition program, and transmits the maintenance data it has read in to network 50 via network IF 27 (process P3) (see S4 in FIG. 9). The data to be transmitted network IF 27 is transmitted to server device 30 via network 50 (process P4).

In FIG. 8, monitor terminal 20 only performs data processing on the maintenance data from a single laser control apparatus 10, but it is also capable of performing data processing on maintenance data from a plurality of laser control apparatus.

In server device 30, the received data (i.e. maintenance data) received via network IF 32 is saved in database 33 by database updating function 212 (process P5) (see S5 in FIG. 9).

When the maintenance data is saved in database 33, the saved data is saved for each apparatus ID, so when maintenance data is simultaneously transmitted from a plurality of monitor terminals, it recognizes which laser device the maintenance data came from based on the apparatus ID contained in the received maintenance data, and updates the relevant contents of the corresponding maintenance data for each of these apparatus IDs.

When the database is updated, server device 30 uses display data preparation and communication function 213 to prepare display data based on the updated database, and outputs it to display terminal 40 (process P6) (see step S6 in FIG. 9). This display data includes the apparatus ID.

Display data of this sort is prepared every time the database is updated based on the maintenance data transmitted from monitor terminal 20, and is prepared according to a preset format based on the contents of this updated database.

Server device 30 then uses display data preparation and communication function 213 to transmit the prepared display data to display terminal 40 via network IF 32 (see S7 in FIG. 9). This transmitted display data is input to display terminal 40 via network 50 (process P7, P8).

In display terminal 40, when display data is received via network IF 42, this display data is stored in main memory 44, and a display program is loaded from the external storage device to main memory 44 and executed.

Next, display terminal 40 executes the display program to interpret the display data stored in main memory 44, and displays it on display device 45 (process P9) (see S8 in FIG. 9).

An example of the display details is shown below.
(1) Display trends in the amount of time for which consumable components have been used since replacement, and in the number of discharge pulses.
(2) Display trends in the variation of values associated with the light quality, such as the laser light wavelength and the discharge voltage.
(3) Display trends in data related to production, such as the number of discharge pulses and the operating time of the laser device.

When the abovementioned processing has been completed, the display produced on display device 45 of display terminal 40 consists of the display details based on the default display data prepared by server device 30.

When the user of display terminal 40 requests data not included in the default display data, such as previous history data for example, input device 46 is operated and the apparatus ID of the laser device (laser control apparatus) to be displayed is input along with the particular event for which the history data is to be displayed.

This request command is transmitted to server device 30 via network IF 42 and network 50 (process P10, P11).

In server device 30, display data is prepared by reading out the history of the maintenance data relating to this event from database 33 according to the request from display terminal 40. This display data is transmitted to display terminal 40 via network IF 32 and network 50 as in the process P7, P8.

In display terminal 40, as in the process P9, display data representing the history is displayed.

An example of the history display contents in this case is shown below.
(1) The number of discharge (or oscillation) pulses is displayed in the form of a line graph.
(2) The error history is displayed in the form of a table.

In this way, it is possible to apprehend the long-term trends in the maintenance data.

As described above, since the database is updated every time an event relating to the laser device occurs based on the maintenance data corresponding to this event, and since display data is prepared based on this updated database and displayed on a display terminal used by a maintenance worker, for example, this maintenance worker can perform maintenance work such as replacement of components or repair of faulty parts by referring to the displayed details.

Next, the implementation of maintenance work based on maintenance data of this sort is described with reference to FIG. 10.

Here, an example is described for the maintenance of components (e.g. discharge electrodes) that become degraded (consumed) as the number of discharge cycles, i.e. the number of pulses, increases. In this example, the laser device is assumed to be a gas laser device.

Figure 10:
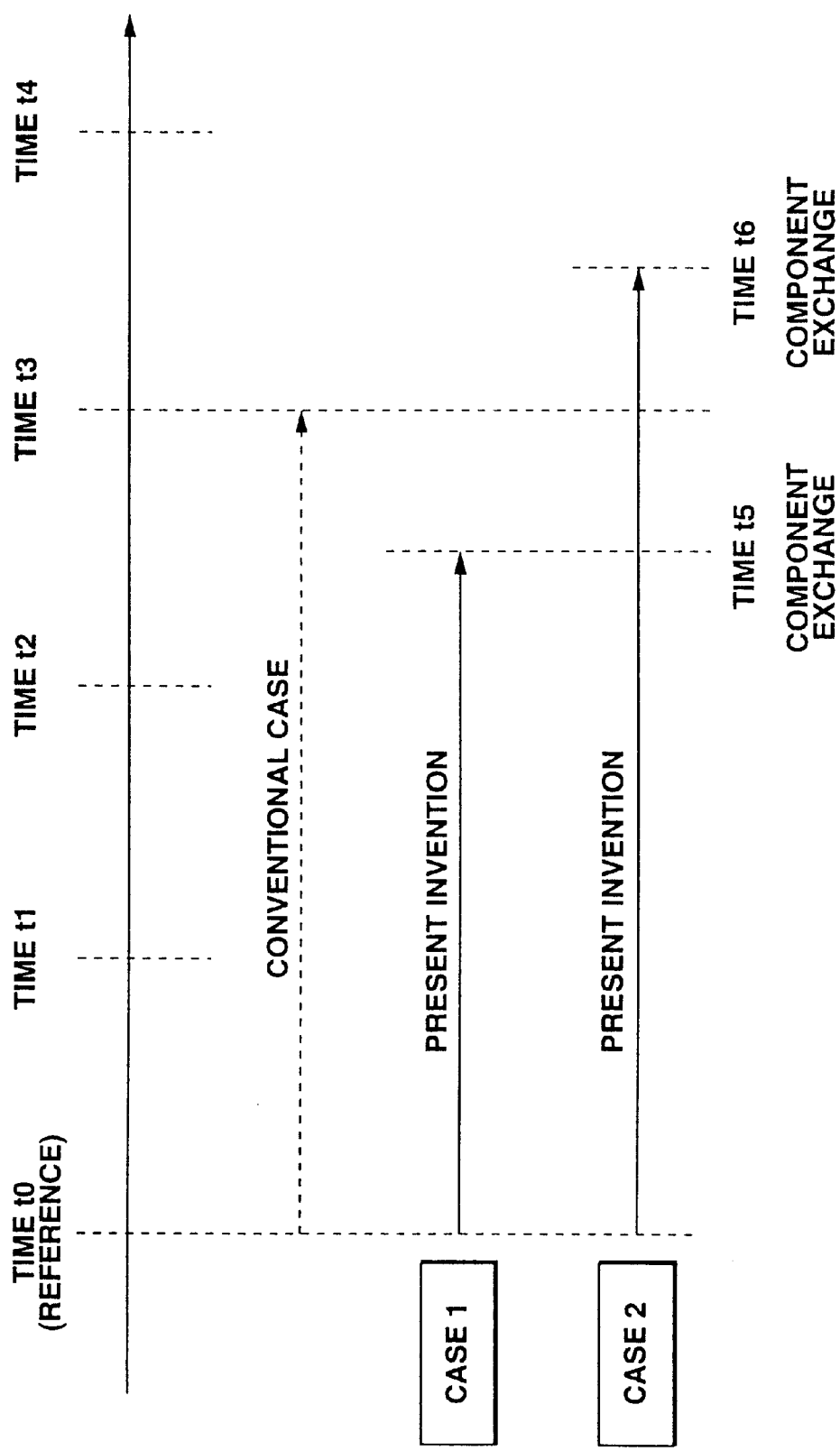
FIG. 10 is a view illustrating how maintenance work is implemented in a laser device management system relating to the first embodiment.

In FIG. 10, t0 is taken to be a reference time, and times t1, t2, t3 and t4 are times occurring at fixed periods thereafter. It is assumed that time t3 is the time at which a periodic maintenance check, for example, would conventionally be made.

When laser oscillation is performed continuously starting from time t0 using a new component, display terminal 40 is able to display trends in the amount of time for which the maintained component is used and the number of discharge pulses after replacement, or trends in the variation of values relating to the light quality of the laser light such as its wavelength and the discharge voltage, as described above.

Consequently, by referring to trend displays of this sort, the maintenance worker might predict, at some time close to time t2 for example, that the component will need to be replaced at some time t5 after time t2 (case 1), or he might predict, at some time close to time t3 for example, that the component will need to be replaced at some time t6 after time t3 (case 2).

In this way, a maintenance worker can perform maintenance work such as replacing the component at the site where the laser device is installed at the time t5 or t6 when it is predicted the component will require replacement.

Conventionally, on the other hand, since maintenance work is performed at fixed periods, a maintenance worker would visit the place where the laser device is installed to replace the component at time t3, for example. Even when the component has to be replaced at time t5 as in case 1 above, it is only replaced at time t3, and as a result the laser output characteristics over the period t5 to t3 are degraded and it becomes impossible to guarantee the quality of the end product.

Alternatively, when the component need not be replaced until time t6 as in case 2 above, the component would still have to be replaced at time t3, and it is thus necessary to replace a component at time t3 even though it would be possible to continue using it until time t5 without introducing any quality-related problems. This makes it impossible to use resources (components) efficiently.

In the above embodiment, server device 30 prepares display data based on the updated database at every database update timing, but it is not limited to this style of operation and can also operate in the following way.

That is, display data could be prepared based on events such as the passage of a fixed period of time (i.e. at fixed time intervals) without the database being updated.

Also, in the abovementioned embodiment, server device 30 prepares display data based on the updated database and automatically transmits it to display terminal 40, but it is not limited to this style of operation and can also operate in the following way.

That is, server device 30 could receive a display data update request along with the apparatus ID of a laser device transmitted from display terminal 40, and could respond to this update request by preparing display data and transmitting it to display terminal 40. In this case, the display data is prepared every time a display data update request is received from display terminal 40, and furthermore the display data is prepared corresponding to the request details.

Also, although monitor terminal 20 and display terminal 40 are configured as separate entities in the above embodiment, it is not limited thereto, and the functions of monitor terminal 20 and display terminal 40 could be implemented in a single terminal.

Furthermore, although monitor terminal 20, server device 30 and display terminal 40 are connected to a single network 50 in the above embodiment, it is not limited thereto, and as long as they are capable of being connected to a network they may also be globally connected.

For example, monitor terminal 20 and server device 30 could be connected to one network, display terminal 40 could be connected to a second network, and the first and second networks could then be connected by a communication channel with the result that server device 30 and display terminal 40 are still able to perform data communication.

In this way, as long as display terminal 40 is capable of being connected to a network, it need not be situated close to monitor terminal 20 or close to the server device.

With the present embodiment as described above, it is possible to obtain the following actions and advantages.

(1) Since it is possible to gather detailed data regarding the data indicating the state of the laser device, it is possible to anticipate the occurrence of a number of problems that have hitherto occurred without warning.

(2) Since it is possible to gather detailed data, it is possible to make accurate predictions about the lifetime of consumable components. Consequently, there is no need to replace components that still perform well enough to be used, including consumable components that have hitherto been replaced at regular intervals, allowing resources (components) to be used efficiently.

(3) Since detailed data on the state of the laser device can be gathered at precise intervals (periodically), the laser state can be tuned more precisely. It is therefore possible to maintain performance aspects such as the laser output characteristics over long periods, and to increase the lifetime of components.

[Second Embodiment]

Figure 11:
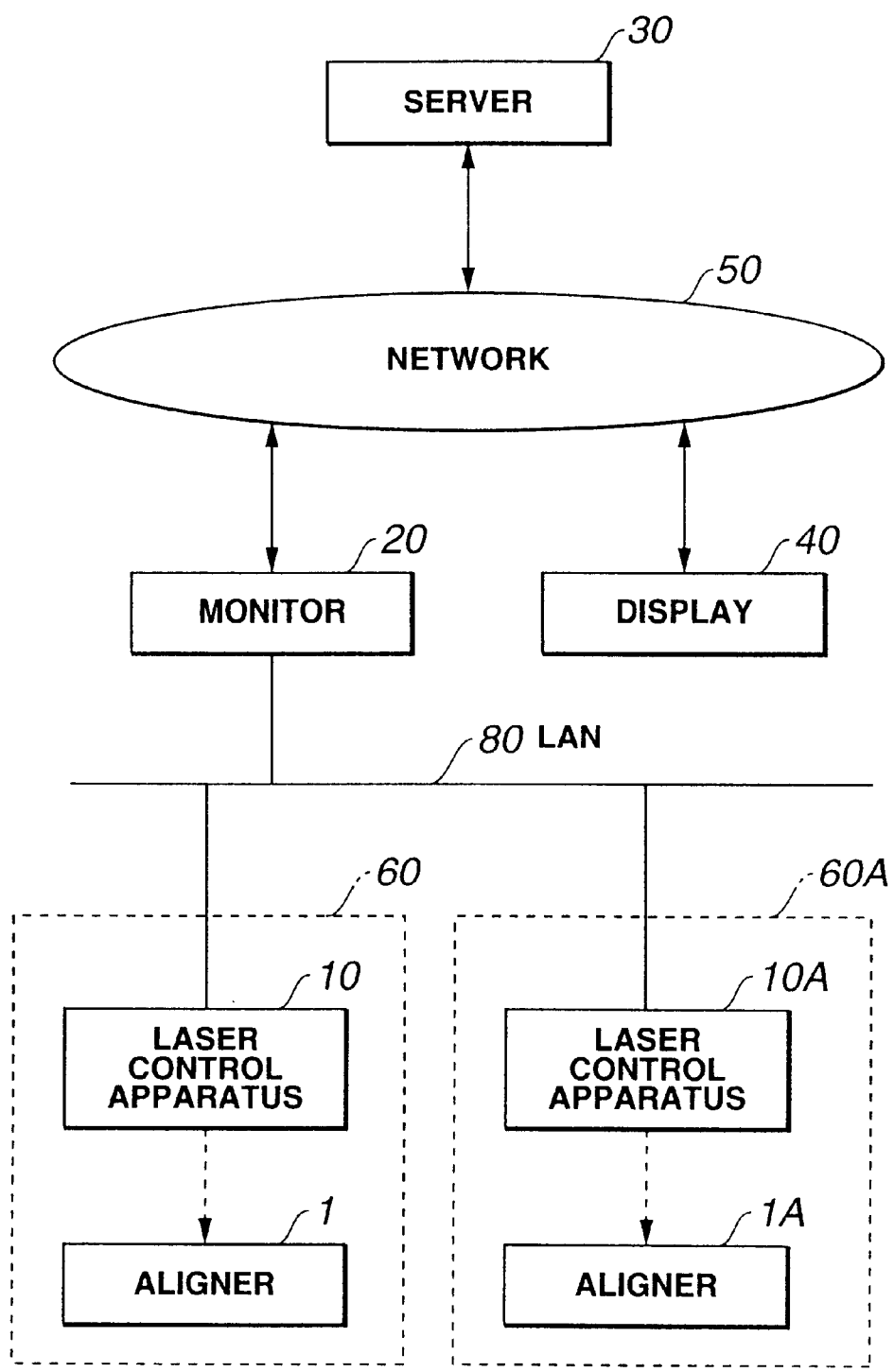
FIG. 11 is a block diagram illustrating the configuration of a laser device management system relating to a second embodiment of the present invention.

FIG. 11 is a block diagram illustrating the configuration of a laser device management system relating to a second embodiment.

This laser device management system is configured by adding a semiconductor fabrication apparatus 60A to the configuration of the laser device management system of the first embodiment shown in FIG. 1, and by connecting a plurality of semiconductor fabrication apparatus 60, 60A (i.e. laser control apparatus 10, 10A) and a monitor terminal 20 thereto via a LAN 80. In this figure, parts that perform the same function as constituent elements shown in FIG. 1 are given the same reference numerals.

This second embodiment basically performs the same processes as the first embodiment, but it also performs some processes that are slightly different.

These different processes are described below with reference to FIG. 12, which shows a functional representation of the laser device management system.

Laser control apparatus 10, 10A load communication programs 215, 216 into main memory 23 from external storage device 17B and execute them (see FIG. 2).

Whereas in the first embodiment an external storage medium (floppy disk) is used to transfer the maintenance data from laser control apparatus 10 to monitor terminal 20, in the second embodiment laser control apparatus 10, 10A transmit the maintenance data to monitor terminal 20 via LAN 80 (process P81). After this process P81 has been completed, a similar process to that of the first embodiment described with reference to FIG. 8 is performed (process P3–P11).

In a laser device management system of this sort, when a specific event occurs such as the passage of a fixed amount of time or the generation of a fixed number of discharge pulses, laser control apparatus 10 acquires maintenance data from the laser device and transmits it to monitor terminal 20 via LAN 80, whereby the same processing as in the first embodiment can thereafter be performed. Accordingly, every time these specific events occur, maintenance data is periodically transmitted to server device 30 and displayed on display terminal 40.

Of course, as in the first embodiment, it is also possible to acquire maintenance data based on maintenance data acquisition commands input to the laser control apparatus from hand-held terminal 19 by an operator.

In the second embodiment, maintenance data could also be acquired when a maintenance data acquisition command is input along with the desired apparatus ID from a terminal connected to network 50, from input device 46 of display terminal 40, for example, for an event other than those specified above. In this case the apparatus ID and maintenance data acquisition command are input to monitor terminal 20 via network 50 and are then transferred from monitor terminal 20 via LAN 80 to the laser control apparatus 10 that controls the laser device indicated by this desired apparatus ID.

Of course, the user of monitor terminal 20 could also request maintenance data by inputting a maintenance data acquisition, command along with the desired apparatus ID by operating input device 46 of monitor terminal 20.

With the second embodiment as described above, it is possible to obtain similar actions and advantages to those of the first embodiment.

Furthermore, with the second embodiment, since data indicating the state of the laser device (i.e. maintenance data) is stored in a database and displayed on display terminal 40 every time a specific event occurs, such as the generation of a fixed number of discharge pulses, a maintenance worker using display terminal 40 can use the periodically displayed display details to periodically and accurately ascertain the state of the laser device in a manner comparable to that of the first embodiment.

This means that the maintenance worker can quickly ascertain problems with the laser device or the lifetime of components based on the display details.

[Third Embodiment]

Figure 13:
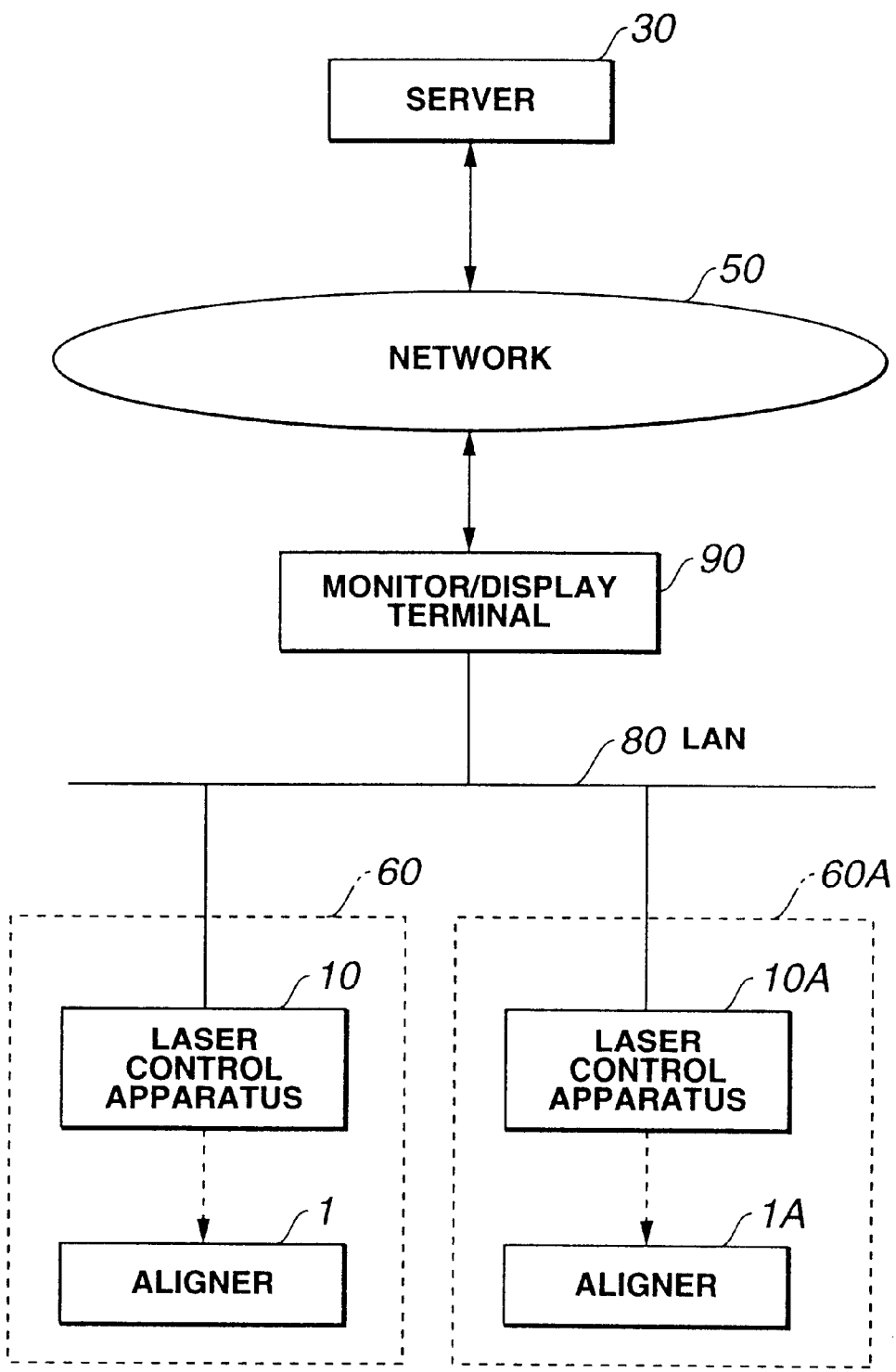
FIG. 13 is a block diagram illustrating the configuration of a laser device management system relating to a third embodiment of the present invention.

FIG. 13 is a block diagram illustrating the configuration of a laser device management system relating to the third embodiment.

The third embodiment assumes a system wherein server device 30 judges the status of the semiconductor fabrication apparatus or laser device based on the maintenance data in the database and, when necessary, notifies a maintenance worker with a warning.

This laser device management system is configured by removing monitor terminal 20 and display terminal 40 from the configuration of the laser device management system according to the second embodiment shown in FIG. 11, and adding a monitor and display terminal 90. In this figure, parts that perform the same function as constituent elements shown in FIG. 1 are given the same reference numerals.

Monitor and display terminal 90 has the same hardware configuration as monitor terminal 20 shown in FIG. 4, and has the functions of monitor terminal and display terminal 40.

Figure 14:
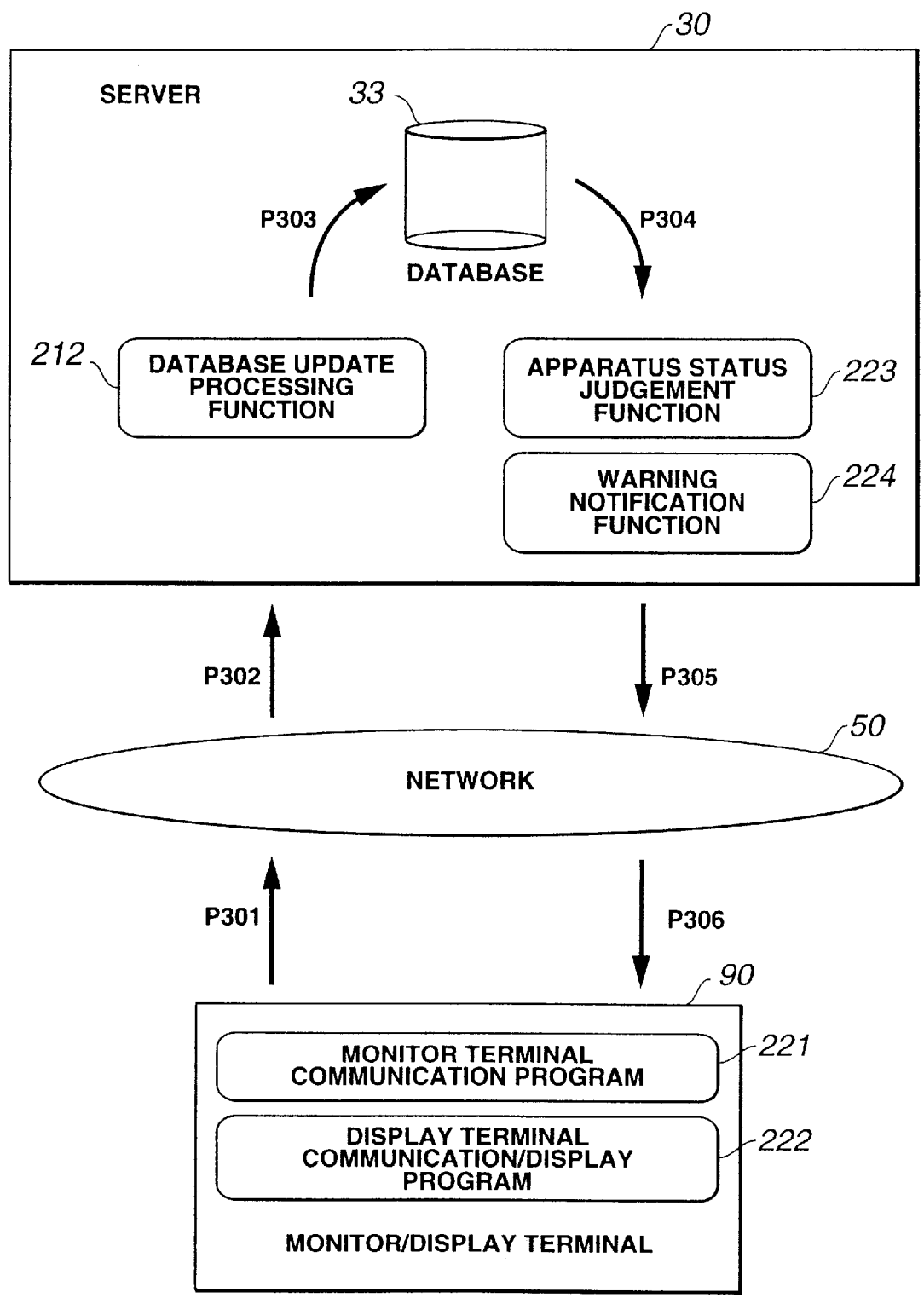
FIG. 14 is a view illustrating a functional representation of a laser device management system relating to the third embodiment.

FIG. 14 shows a functional representation of a laser device management system configured in this way. In FIG. 14, the semiconductor fabrication apparatus has been omitted.

In FIG. 14, monitor and display terminal 90 loads a monitor terminal communication program 221 and a display terminal communication and display program 222 into main memory 23 from external storage device 22. Executing program 221 provides the same functions as the monitor terminal 20, and executing program 222 provides the same functions as display terminal 40.

Server device 30 loads programs exhibiting the respective functions of database updating function 212, device status judgement function 223 and warning notification function 224 into main memory 35 from external storage device 34, and executes these programs to implement the corresponding functions.

Device status judgement function 223 is a function that judges when a fault has occurred or will occur in the near future in the laser device based on the management data stored in database 33.

Warning notification function 224 is a function that receives the judgement from device status judgement function 223 and reports the status of the laser device to monitor and display terminal 90 via network 50 as warning data.

When monitor and display terminal 90 receives the maintenance data transferred from the laser control apparatus via LAN 80, it transfers this maintenance data to server device 30 via network 50 by executing monitor terminal communication program 221.

Figure 15:
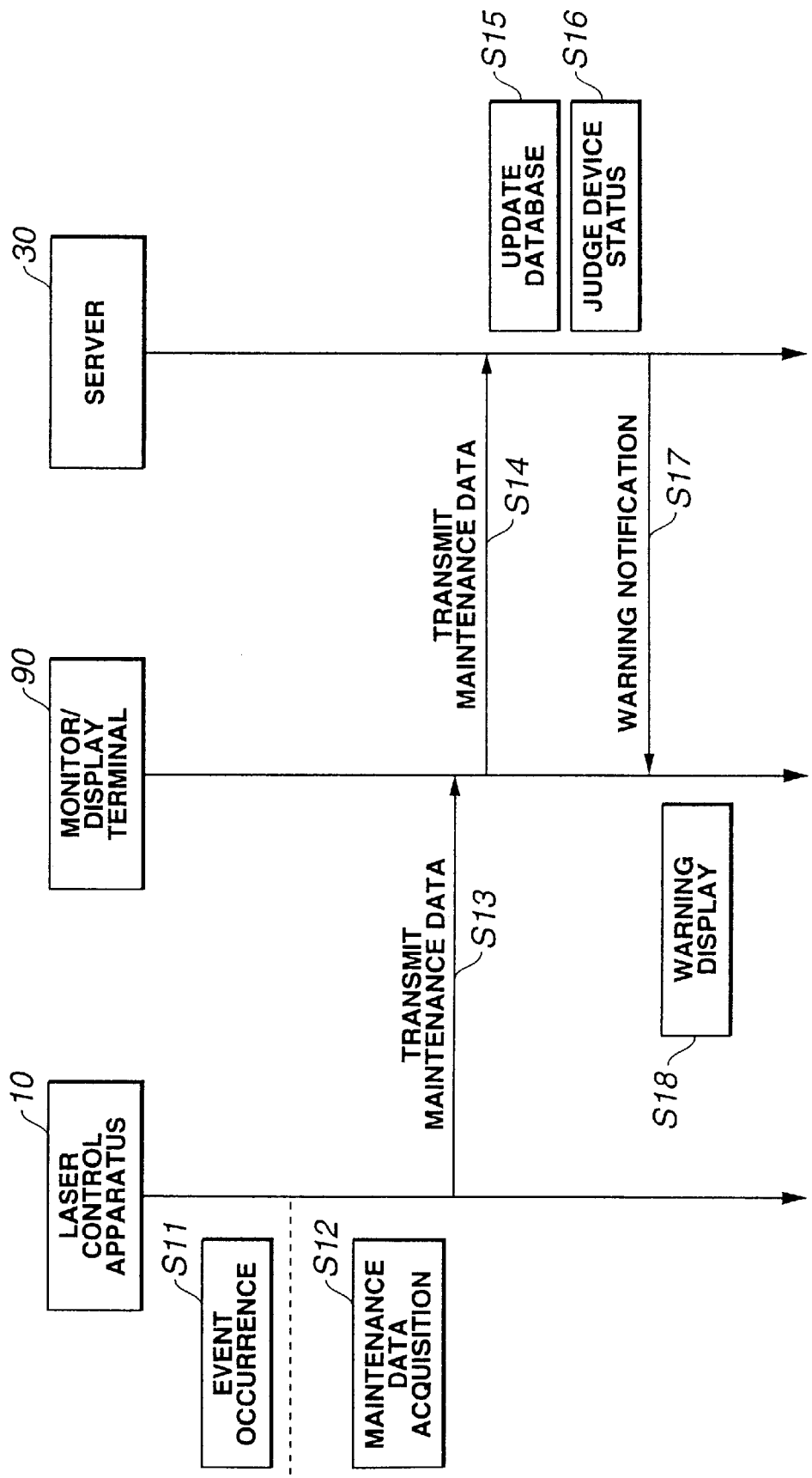
FIG. 15 is a sequence diagram illustrating the data communication processing operations in a laser device management system relating to the third embodiment.

Next, the processing performed by the laser device management system of the third embodiment is described with reference to FIG. 14 and FIG. 15. FIG. 15 is a sequence diagram illustrating the processing operations.

When the laser control apparatus (not illustrated) generates an event (see S11 in FIG. 15), it acquires maintenance data relating to the laser device (see S12 in FIG. 15) and transfers it to monitor and display terminal 90 via LAN 80 (see S13 in FIG. 15).

By executing monitor terminal communication program 221, monitor and display terminal 90 transfers the received maintenance data to server device 30 via network 50 (process P301, P302) (see S14 in FIG. 15).

When server device 30 receives the maintenance data transferred via network 50, it uses database updating function 212 to update database 33 based on this maintenance data (process P303) (see S15 in FIG. 15).

Next, server device 30 uses device status judgement function 223 to judge the status of the laser device (i.e. diagnose the state of the laser device) based on the maintenance data stored in database 33 (process P304) (see S16 in FIG. 15), and it uses warning notification function 224 to notify monitor and display terminal 90 via network 50 of the laser device status based on this judgement result in the form of warning data(process P305, P306) (see S17 in FIG. 15).

Incidentally, when warning data that has been transferred from server device 30 via network 50 is received by monitor and display terminal 90, it runs display terminal communication and display program 222 to display the warning details on the display device based on this received warning data.

In this way, a user such as a maintenance worker for example who is referring to the display device of monitor and display terminal 90 is able to discover problems with the laser device at an early stage based on the displayed warning details, and can perform the prescribed maintenance work.

Since there are various ways in which the state of the laser device can be judged by device status judgement function 223, these judgement methods are described here.

(1) The maintenance data is compared with preset judgement criteria, and the status of the laser device is judged according to the results of this comparison. For example, it might compare the number of pulses with a judgement criterion such as "number of discharge (or oscillation) pulses" included in the maintenance data, and when the number of discharge (or oscillation) pulses has exceeded the judgement criterion value, or when the number of discharge (or oscillation) pulses has reached, say, 70% or 80% of the judgement criterion value, this fact is treated as the judgement result.

Some specific judgement examples are shown below.

(A) Judging when "the operating time of a consumable component or the number of discharge (or oscillation) pulses has exceeded or is close to a stipulated value".

This judgement involves predicting the lifetime of consumable components, and identifying consumable components that have reached the end of their lifetime and need to be replaced when the actual value exceeds the stipulated value, or consumable components that will soon reach the end of their lifetime when the actual value is close to the stipulated value. However, since the maintenance data is gathered periodically, it is possible to ascertain that a consumable component will soon reach the end of its lifetime before the actual value exceeds the stipulated value, allowing measures to be taken at an early stage.

(B) Judging when "the device operating time or the number of discharge (or oscillation) pulses has exceeded or is close to a stipulated periodic maintenance interval".

(2) Based on the "number of discharge (or oscillation) pulses" included in the maintenance data stored according to events produced during a fixed period in the past, obtain the time-series variation, i.e. a graph illustrating the characteristics of the number of discharge pulses with respect to time (period), and judge the state of the laser device based on the slope of this characteristic graph. When the slope of this characteristic graph exceeds a preset gradient ratio, or when the slope of this graph is less than a preset gradient ratio, this fact is treated as the judgement result.

A specific judgement example is shown below.

(A) Judging when "the variation of a value associated with light quality, such as the laser light wavelength or the discharge voltage, has exceeded or is close to a stipulated value".

In this case, the abovementioned characteristic graph could be output as long-term trend data instead of being used to make judgements.

In the third embodiment, server device 30 transmits warning data to monitor and display terminal 90. However, it is not limited to this mode of operation and could also operate as follows.

That is, it could transmit the warning data to the monitor and display terminal 90 or a preset terminal by facsimile (FAX) or electronic mail (E-mail).

In this case, the preset terminal could be a terminal connected to network 50 on the premises where monitor and display terminal 90 is installed, or it could be a terminal that is independently connected to network 50.

It is also necessary for server device 30 to store notification contact details such as FAX numbers or e-mail addresses corresponding to the apparatus IDs. In this way, when server device 30 issues a warning notification concerning the judgement results judged based on the maintenance data in the database (i.e. the status of the laser device), it can transmit the warning data to an appropriate notification contact by obtaining the FAX number or e-mail address stored along with the apparatus ID contained in this maintenance data.

With the third embodiment as described above, it is possible to obtain the same actions and advantages as the second embodiment.

Furthermore, with the third embodiment, since the judgement results of the judgement process in server device 30 are displayed as warning data on display device 40, it is possible for a maintenance worker to discover problems with the laser device or the lifetime of components by monitoring the display details displayed on display device 40 at an earlier stage than in the second embodiment, where the maintenance worker himself apprehends problems with the laser device or the lifetime of components. Also, depending on the warning details regarding problems with the laser device or the lifetime of components, it is possible to take prompt remedial action such as implementing maintenance work.

[Fourth Embodiment]

The laser device management system relating to the fourth embodiment is configured in the same way as the second embodiment shown in FIG. 11.

In this fourth embodiment, it is assumed that the internet is used for network 50, and that the system encrypts any data to be transmitted via the internet to avoid divulging various types of data such as maintenance data.

Figure 16:
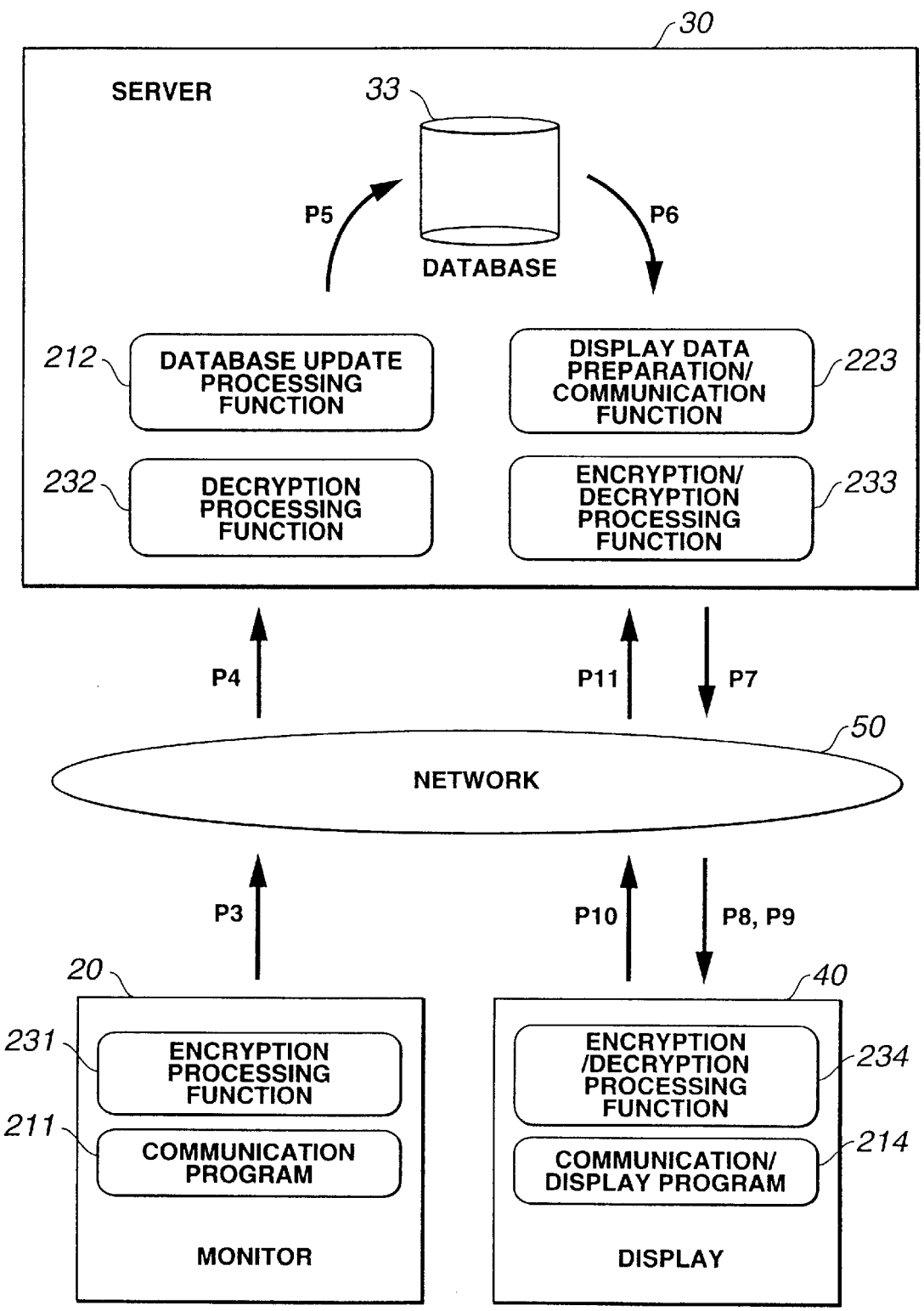
FIG. 16 is a block diagram illustrating the configuration of a laser device management system relating to a fourth embodiment.

FIG. 16 shows a functional representation of a laser device management system relating to the fourth embodiment. In FIG. 16, the semiconductor fabrication apparatus has been omitted.

Figure 12:
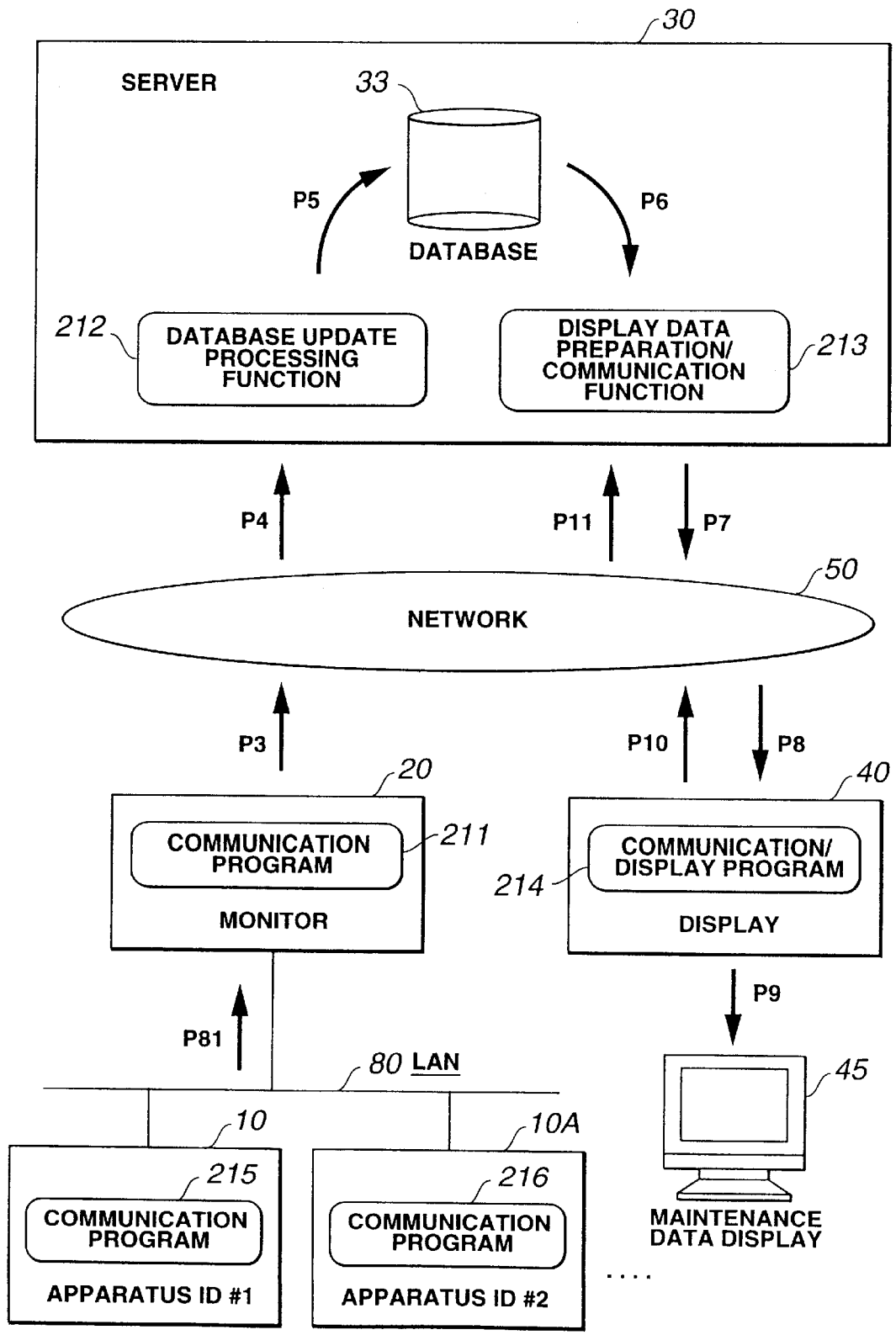
FIG. 12 is a view illustrating a functional representation of a laser device management system relating to the second embodiment.

This laser device management system is configured by adding the following functions to the functional configuration of the laser device management system of the second embodiment shown in FIG. 12.

Monitor terminal 20 has an encryption processing function 231. Server device 30 has a decryption processing function 232 and an encryption and decryption processing function 233. Display terminal 40 has an encryption and decryption processing function 234. A program indicating the processing procedure for implementing these functions is stored in the external storage device of the corresponding constituent element, and is loaded into main memory and executed as required.

Although this fourth embodiment performs the same processing as the second embodiment shown in FIG. 12, it differs from the second embodiment in that encryption or decryption is performed when data is transmitted or received.

The processing that distinguishes this embodiment from the second embodiment is described below with reference to FIG. 16.

When monitor terminal 20 receives maintenance data from the laser control apparatus, it loads a program indicating the processing procedure for implementing encryption processing function 231 into main memory 23 from external storage device 22 and executes it, whereby the received maintenance data is subjected to an encryption process, after which it is transferred to server device 30.

When server device 30 receives the encrypted maintenance data, it uses decryption processing function 232 to perform decryption processing on this encrypted maintenance data. Database 33 is then updated based on this decrypted maintenance data.

Server device 30 then uses encryption and decryption processing function 233 to encrypt the display data prepared based on the maintenance data in the database. This encrypted display data is transferred to display terminal 40 via network 50.

In display terminal 40, the transferred encrypted display data is decrypted by encryption and decryption processing function 234 and displayed on display device 45.

When display terminal 40 requests the acquisition of maintenance data from server device 30, the data is transferred after the apparatus ID and maintenance data request have been encrypted by encryption and decryption processing function 234. On the other hand, in server device 30, the encrypted apparatus ID and maintenance data request are decoded by encryption and decryption processing function 233 before preparing the display data.

In the fourth embodiment, it is possible to add corresponding compression/decompression functions to monitor terminal 20, display terminal 40 and server device 30. These compression/decompression functions can be used to subject the outgoing data to a compression process when it is transmitted, and to subject the incoming data to a decompression process when it is received.

With the fourth embodiment as described above, it is possible to obtain the same actions and advantages as those of the second embodiment.

Furthermore, with the fourth embodiment, since the maintenance data relating to the laser device is subjected to data compression and encryption when it is transmitted from monitor terminal 20 to server device 30 or from server device 30 to display terminal 40, it is not necessary to use a private circuit for the network 50 used between server device 30, monitor terminal 20 and display terminal 40, and an inexpensive public circuit such as the internet can be used instead.

Also, since the maintenance data is compressed before data communication is performed, the amount of data to be communicated can be reduced and the communication time can be made shorter.

[Fifth Embodiment]

Figure 17:
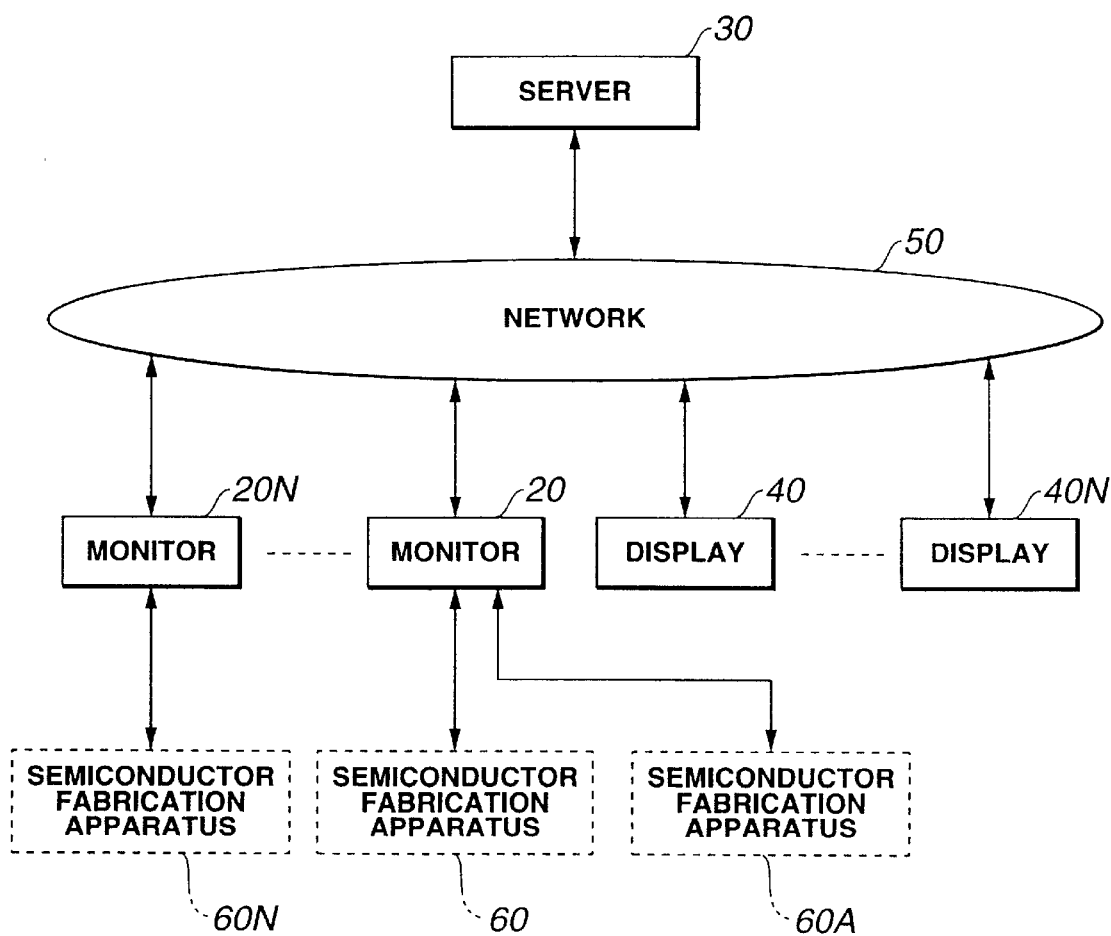
FIG. 17 is a block diagram illustrating the configuration of a laser device management system relating to a fifth embodiment of the present invention.

FIG. 17 is a block diagram illustrating the configuration of a laser device management system relating to the fifth embodiment.

This laser device management system is configured by adding a monitor terminal 20N, which performs the same function as monitor terminal 20, and a display terminal 40N, which performs the same function as display terminal 40, to the configuration of the laser device management system of the second embodiment shown in FIG. 11. In this figure, parts that perform the same function as constituent elements shown in FIG. 11 are given the same reference numerals.

In this fifth embodiment, a system is assumed in which a plurality of monitor terminals and a plurality of display terminals are connected to network 50, and a plurality of monitor terminal users and a plurality of display terminal users, i.e. a plurality of clients, access a server device in order to refer to the display data based on maintenance data.

Figure 18:
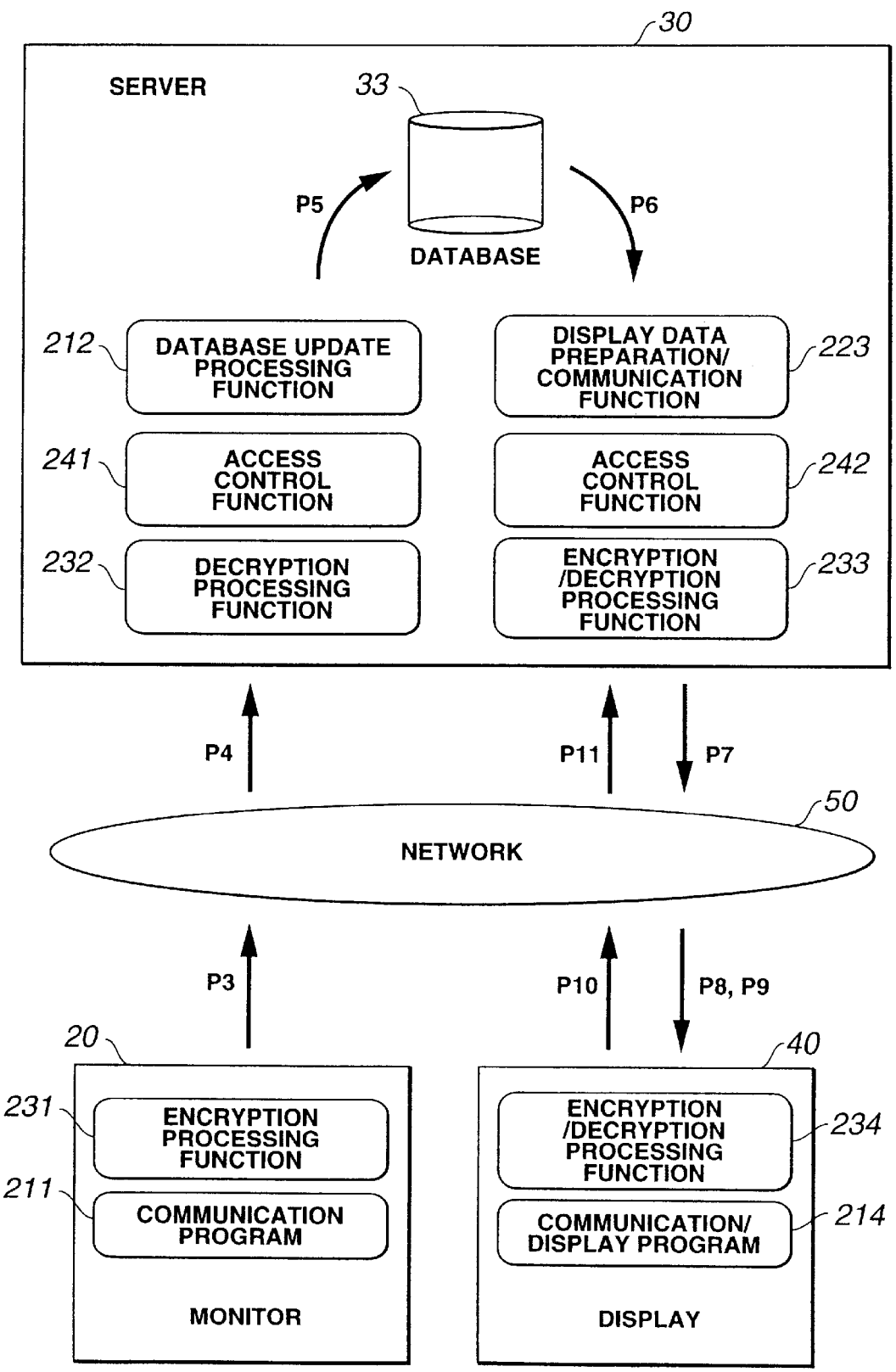
FIG. 18 is a view illustrating a functional representation of a laser device management system relating to the fifth embodiment.

FIG. 18 shows a functional representation of the laser device management system. In FIG. 18, the semiconductor fabrication apparatus is omitted.

This laser device management system is configured by adding access control functions 241, 242 to server 30 in the functional configuration of the laser device management system of the fourth embodiment shown in FIG. 16. Programs for implementing each of these functions are stored in the external storage device of the corresponding constituent elements, and are loaded into main memory and executed when required.

Access control function 241 controls access from a plurality of monitor terminals, and access control function 242 controls access from a plurality of display terminals. Of course, access from a plurality of monitor terminals and a plurality of display terminals could also be controlled by a single access control function instead of splitting this functionality between two access control functions.

In this fifth embodiment, although the processing is implemented in basically the same way as in the fourth embodiment shown in FIG. 16, it differs from the fourth embodiment in terms of how access to server device 30 is controlled.

Figure 19:
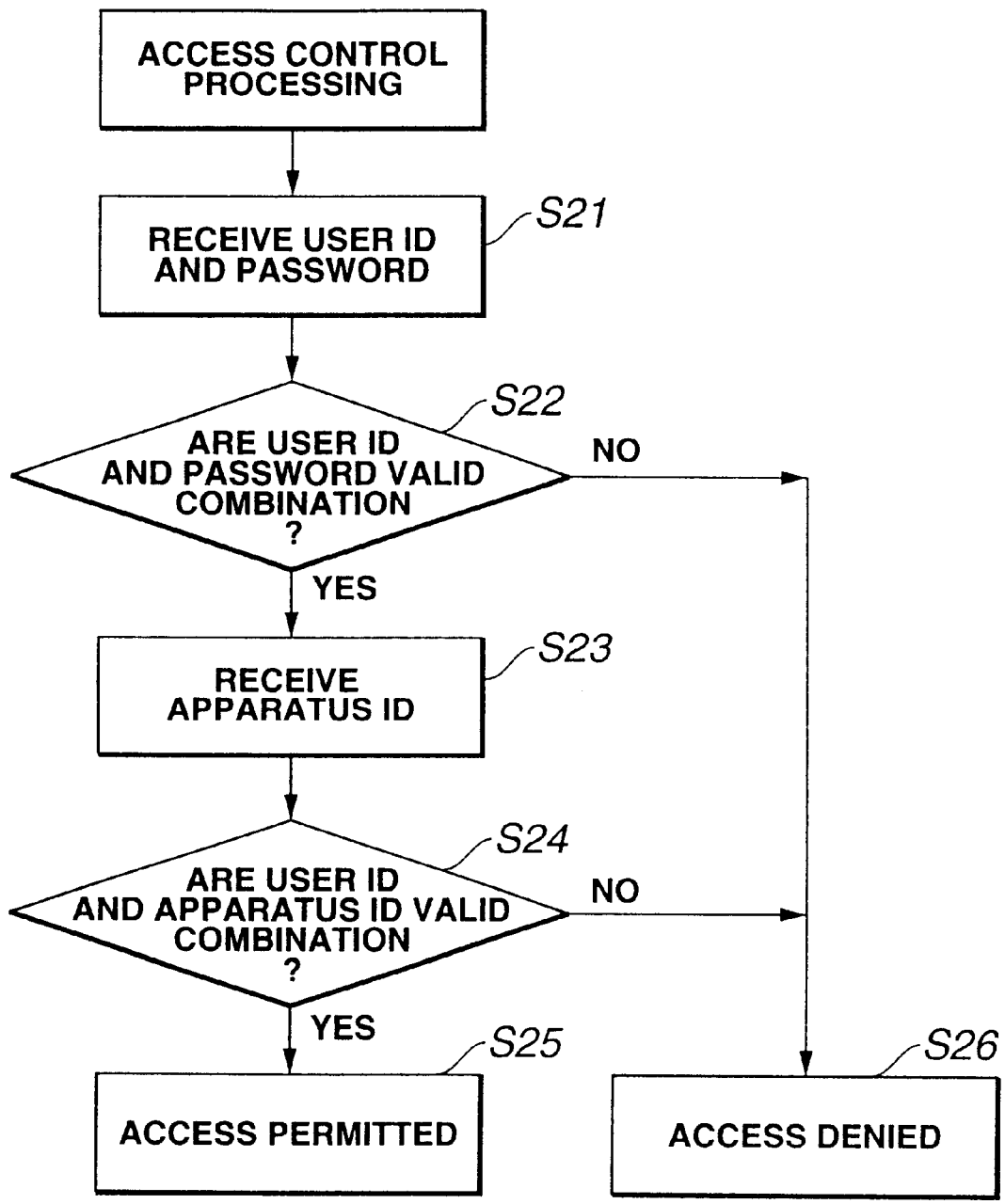
FIG. 19 is a flowchart illustrating the access control processing operations in a laser device management system relating to the fifth embodiment.

The way in which the processing differs from that of the fourth embodiment is described below with reference to FIG. 19. FIG. 19 is a flowchart illustrating the access control processing operations in the server device.

First of all, when the plurality of users that use the plurality of monitor terminals 20, 20N and the plurality of display terminals 40, 40N request permission to access server device 30, they input a user ID and a password which are transmitted to server device 30.

Here, it is assumed that a display terminal 40 issues a request for access permission, and that it is possible to request display data for a device indicated by apparatus ID=#1 from among the semiconductor fabrication apparatus or laser devices managed by monitor terminal 20. It is also assumed that a user A having a user ID=XX40 and password=YY40 is a valid user who is authorized to access server device 30.

It is also assumed that the user ID=XX40, the password=YY40 and apparatus ID=#1 are associated with each other and stored in server device 30.

When server device 30 has received the user ID (XX40) and password (YY40) from user A (step S21) it judges whether or not the received user ID and password are a valid combination based on the combinations of user IDs and passwords stored as data therein (step S22), and when it judges that the combination is valid, it requests an apparatus ID from this user.

The user responds by inputting the desired apparatus ID indicating a semiconductor fabrication apparatus or laser device, and transmitting it to server device 30. When the combination is judged to be valid at step S22, this user A is deemed to be a valid user with authorization to access server device 30.

When server device 30 has received the desired apparatus ID input by user A (step S23), it judges whether or not the previously received apparatus ID and user ID (XX40) are a valid combination based on the combinations of apparatus IDs and user IDs stored as data therein (step S24).

At step S24, when server device 30 has judged that the combination of the apparatus ID "#1" and user ID "XX40" is valid, it informs this user A that permission to access has been granted (step S25).

On the other hand, when the combination of the user ID and password from user A is deemed invalid at step S22, or when the combination of the user ID "XX40" and an apparatus ID (#2) indicating another laser device is deemed invalid at step S24, server device 30 informs this user A that permission to access has been denied (step S26).

If user A is granted permission to access, he is able to transmit a request to server device 30 for display data relating to maintenance data such as the default display data or display data for the previous history data based on the maintenance data according to the event.

In the fifth embodiment, a request for display data relating to maintenance data is performed after permission to access has been granted. However, it is not limited to this mode of operation, and the apparatus ID could also be transmitted to server device 30 along with this request for display data.

In this case, the display data corresponding to this apparatus ID is prepared and transmitted to the user when it is judged that access is to be granted, but when it is judged that access is to be denied then the user is informed of this judgement.

With the fifth embodiment as described above, it is possible to obtain the same effects and advantages as those of the fourth embodiment.

Also, in the fifth embodiment, since server device 30 certifies the user based on the apparatus ID, user ID and password before transmitting display data (i.e. maintenance data) in response to a request, it is possible to prevent data from being divulged between different users even when requests for the transmission of data are transmitted to server device 30 from a plurality of users. For example, it is possible to prevent display data concerning a laser device that is maintained and managed by user B from being displayed on the display terminal of user A. In this case, the display data concerning the laser device maintained and managed by user A is displayed on user A's display terminal.

Furthermore, with the fifth invention, since a display terminal 40 that accesses server device 30 is not only certified based on the apparatus ID, user ID and password, but also receives display data that has been compressed and encrypted, the data is kept secret. This means that it is possible to use a general-purpose computer as display terminal 40, and that it is possible to use a general-purpose communication channel, such as a public circuit, as network 50.

[Sixth Embodiment]

The laser device management system relating to the sixth embodiment is configured in the same way as the second embodiment shown in FIG. 11.

In this sixth embodiment, a system is assumed in which a program for implementing each of the terminal functions is downloaded from server device 30 by monitor terminal 20 and display terminal 40, and this downloaded program is executed.

Figure 20:
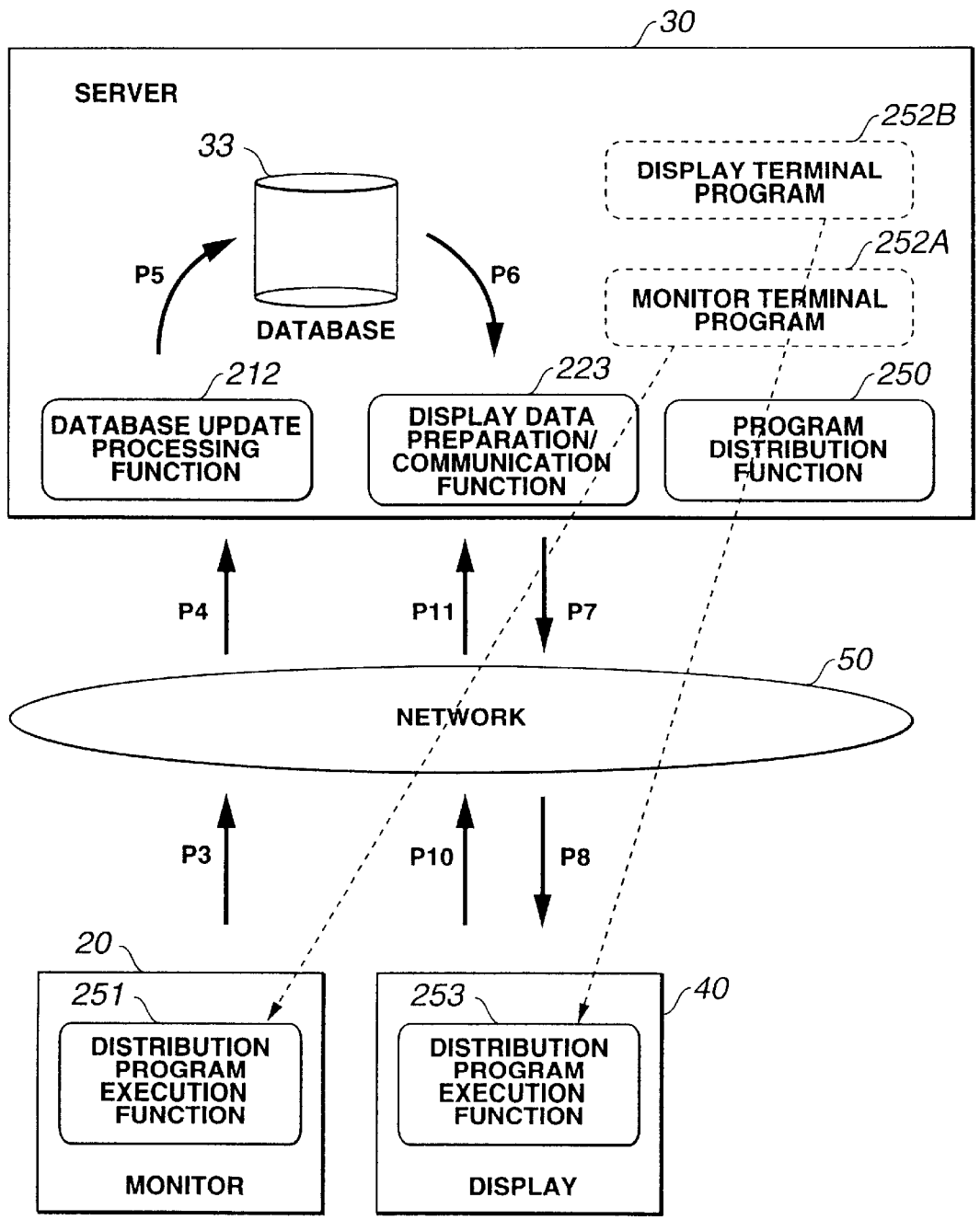
FIG. 20 is a view illustrating a functional representation of a laser device management system relating to a sixth embodiment.

FIG. 20 shows a functional representation of a laser device management system relating to the sixth embodiment.

This remote maintenance system is functionally configured by adding a distribution program execution function 251 to monitor terminal 20, adding a program distribution function 252 to server device 30, and adding a distribution program execution function 243 to display terminal 40 in the functional configuration of the laser device management system of the second embodiment shown in FIG. 12. Programs for implementing each of these functions are stored in the external storage devices of the corresponding constituent elements, and are loaded into main memory and ran when necessary.

In this figure, parts that perform the same function as constituent elements shown in FIG. 12 are given the same reference numerals. Also, the semiconductor fabrication apparatus has been omitted.

Program distribution function 252 is a function for distributing a monitor terminal program 252A to monitor terminal 20 and distributing a display terminal program 252B to monitor terminal 20. Distribution program execution functions 251, 253 are functions for executing the distributed programs. Monitor terminal program 252A and display terminal program 252B are stored in external storage device 34 every time a new version comes out.

Also, the server device 30 in this case not only stores the maintenance data, but also stores properties of the data (format, number of items) and an analysis method (e.g. processing functions for analyzing the maintenance data in order to predict the lifetime of components or anticipate problems).

This sixth embodiment basically performs the same processing as the second embodiment, but it differs from the second embodiment in that a program distribution process is performed.

The program distribution process of server device 30 is described below.

It is assumed here that a program executed by the laser control apparatus, e.g. a program indicating the processing procedure for acquiring and outputting maintenance data, is upgraded and the data properties (format, number of items) are changed.

In this case, it will become impossible to analyze data in monitor terminal 20, server device 30 and display terminal 40 unless they can be made compatible with the data properties (format, number of items) that are valid when the upgraded program is executed.

Therefore, in the sixth embodiment, the abovementioned data properties and analysis method are modified and the monitor terminal program 252A and display terminal program 252B are modified—by a server device manager, for example—according to the modification details of the program executed by the laser control apparatus in server device 30.

Server device 30 then transmits a message to the display terminal or monitor terminal to the effect that the program has been upgraded.

For example, based on the "message to the effect that the display terminal program has been upgraded" displayed on the screen of the display terminal, display terminal 40 inputs data necessary for user authorization such as a user ID and password, and a message to the effect that this program will be downloaded.

This data is transmitted to server device 30 via network 50, whereby server device 30 transmits the upgraded display terminal program 252B to the display terminal corresponding to the received user ID and password.

In display terminal 40, the received upgraded display terminal program 252B is stored in external storage device 43. That is, this display terminal program 252B is downloaded to external storage device 43 via network 50.

In display terminal 40, the distribution program execution function 253 is used to execute the downloaded display terminal program 252B, making it possible to display the display data based on the execution of the new display terminal program 252B or the upgraded display terminal program 252B.

Similarly, in monitor terminal 20, the upgraded monitor terminal program 252A that is capable of working with the updated data properties is downloaded from server device 30 via network 50.

Conventionally, to use monitor terminal program 252A or display terminal program 252B, it has been necessary to install these programs at the same location where monitor terminal 20 and display terminal 40 are situated. Since it is highly likely that these terminals are dispersed among a plurality of locations, modifying the terminal functions and performing maintenance on the terminal programs are troublesome tasks that require corresponding programs (e.g. upgraded programs) to be installed at each location where the terminals are installed.

With the sixth embodiment as described above, it is possible to obtain the same effects and advantages as those of the second embodiment.

Also, with the sixth embodiment, since display terminal 40 is able to download a display terminal program from server device 30 and execute it, it is always possible to execute the most up-to-date display terminal program—even when the display terminal program is upgraded—by downloading this display terminal program from the server device every time it is upgraded.

Consequently, by equipping server device 30 with a plurality of display programs for use by display terminals, for example, it is easy to provide means of analyzing various types of maintenance data (e.g. processing functions that analyze the maintenance data to predict the lifetime of components or anticipate problems). This means that the terminal programs can easily be updated and maintained.

Furthermore, with the sixth invention, since server device 30 not only stores state data for semiconductor fabrication apparatus or laser devices situated at a plurality of factories but also possesses the data properties (format, number of items) and the abovementioned analysis methods themselves, server device 30 is able to transmit display data according to the details of these display properties and analysis methods to the display terminal that requested the display data.

Consequently, even if the laser device control software (i.e. the software executed by the laser control apparatus) is modified or the data properties are modified, the parts of the display terminal program corresponding to the properties of this data can be amended in server device 30 and this amended display terminal program can be distributed to the display terminals so that no amendments need to be made to the display terminal program at the display terminals themselves.

[Seventh Embodiment]

The laser device management system relating to the seventh embodiment is configured in the same way as the second embodiment shown in FIG. 11.

This seventh embodiment assumes a system in which the programs and parameters used to control the semiconductor fabrication apparatus or laser device are modified by display terminal 40.

Figure 21:
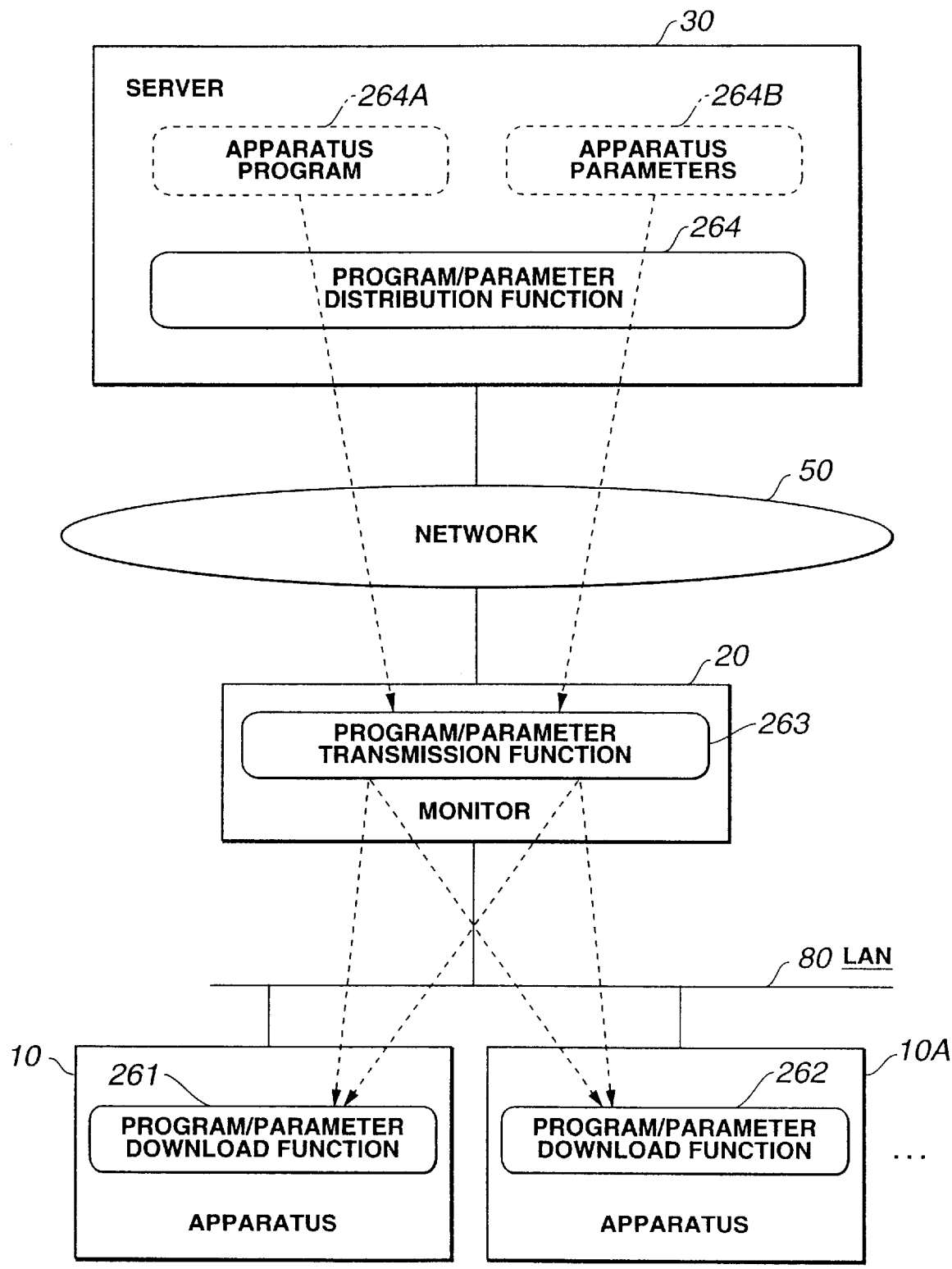
FIG. 21 is a view illustrating a functional representation of a laser device management system relating to a seventh embodiment.

FIG. 21 shows a functional representation of a laser device management system relating to the seventh embodiment.

This laser device management system is configured by adding program and parameter download functions 261, 262 to laser control apparatus 10, 10A, adding a program and parameter transfer function 263 to monitor terminal 20 and adding a program and parameter distribution function 264 to server device 30 in the functional configuration of the laser device management system of the second embodiment shown in FIG. 12. The programs used to implement each of these functions are stored in the external storage devices of each corresponding constituent element, and are loaded into main memory and executed when necessary.

In this figure, parts that perform the same function as constituent elements shown in FIG. 12 are given the same reference numerals. Also, display terminal 40 has been omitted from this figure.

Program and parameter distribution function 264 is a function whereby the device program 264A indicating the program executed in the laser control apparatus and the device parameters 264B indicating the parameters set in the laser control apparatus are distributed to laser control apparatus 10, 10A.

Program and parameter transfer function 263 is a function whereby device program 264A or device parameters 264B are transferred to laser control apparatus 10, 10A.

Program and parameter download functions 261, 262 are functions for downloading the transferred device program 264A or device parameters 264B.

Device program 264A and device parameters 264B are stored beforehand in external storage device 34.

Although this sixth embodiment basically performs the same process as the second embodiment, it differs from the second embodiment in that it also performs processes for the distribution of programs and parameters.

The program and parameter distribution processing performed by server device 30 is described below.

For example, it is assumed that a maintenance worker recognizes that there has been a change in the operational status of the laser device by monitoring the display details displayed on display terminal 40 and, to obtain a constant discharge energy, operates input device 46 to input the apparatus ID of this laser device, change the values of the parameters of this laser device and issue a parameter modification request. Here it is assumed that the modified parameters are device parameters 264B.

These device parameters 264B and the apparatus ID are input to server device 30 via network 50 and stored in main memory 35.

On doing so, server device 30 loads program and parameter distribution function 264 into main memory 35 from external storage device 34 in order to distribute the device parameters 264B, and executes it.

In this way, the device parameters 264B and apparatus ID that have already been stored in main memory 35 are transmitted to the monitor terminal (e.g. monitor terminal 20) that manages the laser control apparatus controlling the laser device indicated by this apparatus ID.

These device parameters 264B and the apparatus ID are input to monitor terminal 20 via network 50. Monitor terminal 20 transfers the received device parameters 264B to the laser control apparatus (e.g. laser control apparatus 10) that controls the laser device indicated by the received apparatus ID.

This laser control apparatus 10 loads a program for executing program and parameter download function 261 into memory 17A from external storage device 17B and executes it, whereby the transferred device parameters 264B are downloaded.

It is also possible to download device program 264A from server device 30 to laser control apparatus 10 in the same way as above.

The reason for modifying the parameter values according to the operational status of the laser device is as follows:

That is, to output the constant discharge energy produced by the laser device is required to be kept constant, and this can be achieved by adjusting the voltage and gas pressure can be adjusted. However, there is a trade-off relationship between the voltage and gas pressure. Also, the lifetime of the laser chamber is determined by the long-term tendency for the working gas pressure to increase.

At the introductory phase, therefore, the working voltage is set to a low value while the working gas pressure is set to a high value. When an increase in the working gas pressure due to degradation or the like has been detected, the working gas pressure can be brought down again by setting a higher working voltage. This approach, whereby the working voltage is varied according to the state of the laser device (the working gas pressure) allows the lifetime of the laser chamber to be extended beyond what would otherwise be obtained with a fixed working voltage.

Consequently, in the seventh embodiment, it is possible to gather data in a display terminal 40 situated at a remote location as described above with regard to data indicating the state of the laser device (maintenance data) in response to events that are generated after the oscillation of a fixed number of discharge pulses, for example.

As a result, a maintenance worker can set the parameter values so as to achieve the optimal working voltage in this laser device while taking factors such as the effects of mechanical differences (fixed differences) in the discharge electrodes or windows or the like into consideration by ascertaining the working voltage, working gas pressure and oscillation load based on the maintenance data collected at regular intervals.

Conventionally, although methods are employed for resetting the working voltage according to the number of shots when an increase in the working gas pressure due to degradation or the like has been detected, it has not always been possible to obtain optimal results depending on the mechanical differences and the operational status of the laser device.

With the seventh embodiment as described above, it is possible to obtain the same actions and advantages as those of the second embodiment.

Furthermore, with the seventh embodiment it is possible to maintain the program and parameters used to control a laser device from a remote location, allowing the efficiency of laser device maintenance work to be improved.

[Eighth Embodiment]

Figure 22:
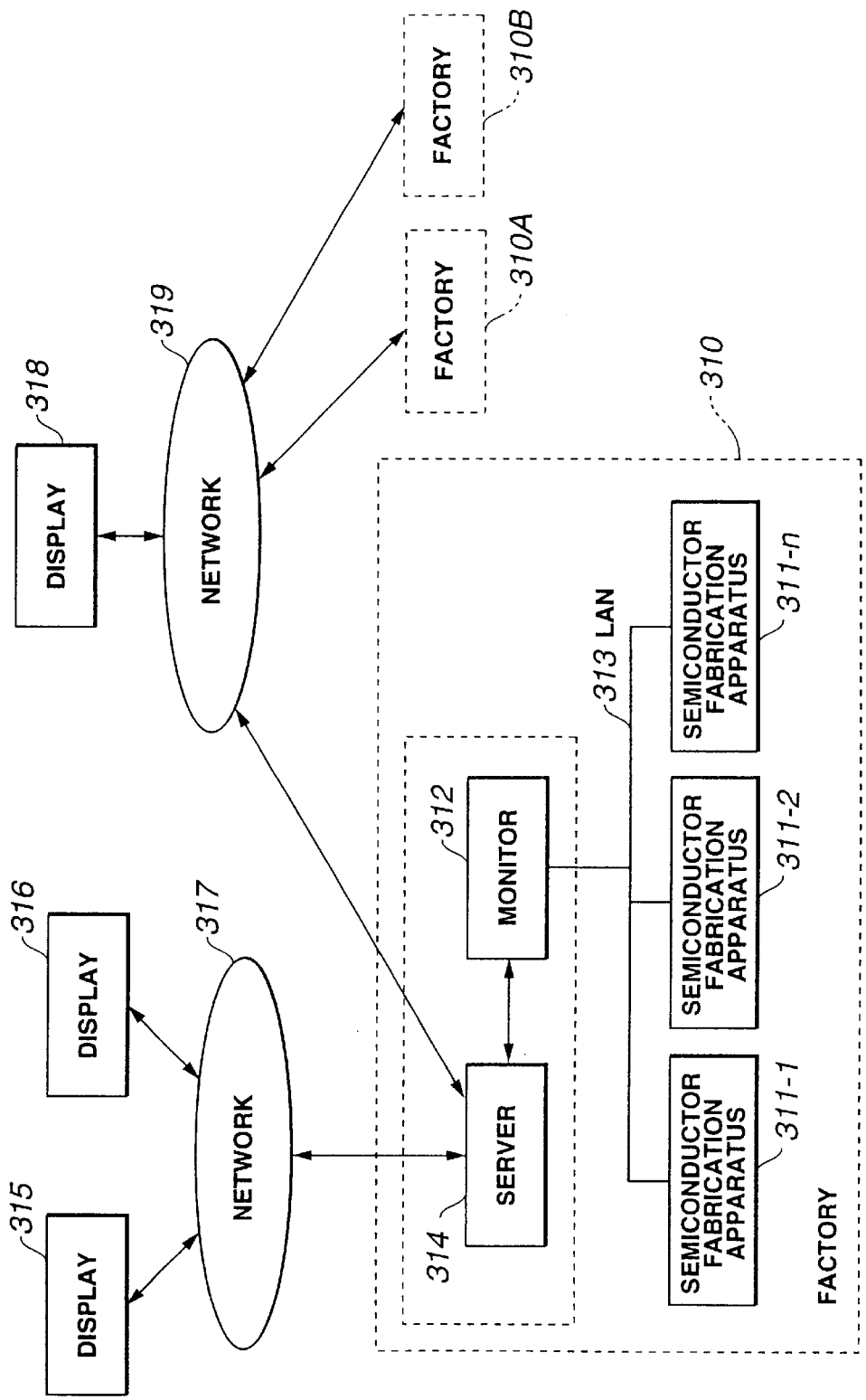
FIG. 22 is a block diagram illustrating the configuration of a laser device management system relating to an eighth embodiment.

FIG. 22 is a block diagram illustrating the configuration of a laser device management system relating to the eighth embodiment.

This laser management system is basically configured in the same way as the laser device management system of the second embodiment shown in FIG. 11 but differs from the second embodiment in that the monitor terminal is provided with the functions of a server device.

That is, in this laser device management system, a plurality of semiconductor fabrication apparatus 311-1, 311-2, . . . , 311-n and a monitor terminal 312 are connected together via a LAN 313 at a single factory 310. Monitor terminal 312 also performs data communication locally with a server device 314. Here, monitor terminal 312 also emulates the functions of a server device 314.

Server device 314 is connected with a plurality of display terminals 315, 316 via a network 317. Server device 314 is also connected to a display terminal 318 via a network 319.

Furthermore, display terminal 318 is connected to server devices in factories 310A, 310B via network 319.

The functions of each of the abovementioned constituent elements are the same as those of the laser device management system of the second embodiment shown in FIG. 11. Accordingly, they are not described here.

With this eighth embodiment, it is possible to keep the data within the factory because the server device functions are incorporated into the monitor terminal.

[Ninth Embodiment]

Figure 23:
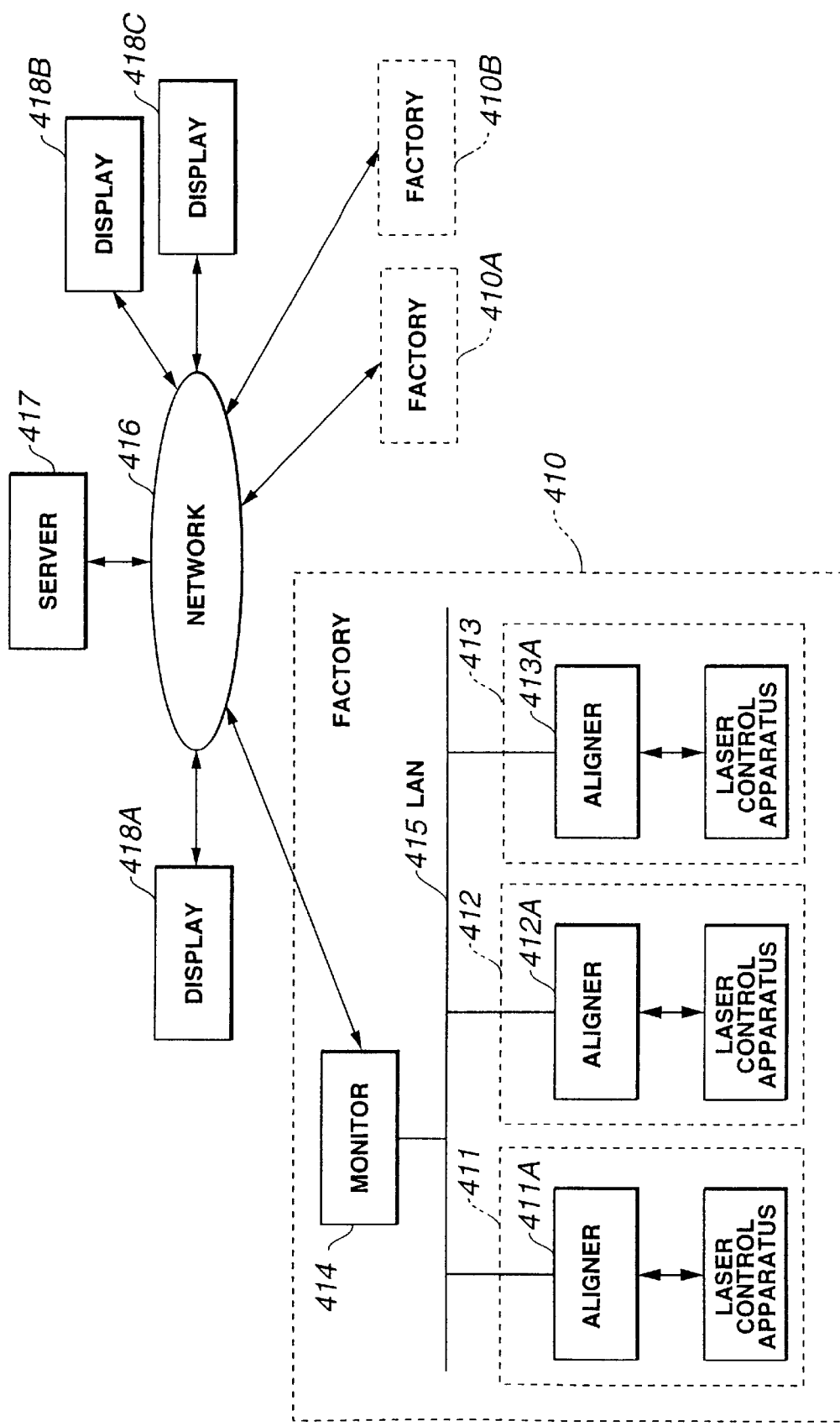
FIG. 23 is a block diagram illustrating the configuration of a laser device management system relating to a ninth embodiment.

FIG. 23 shows a block diagram of a laser device management system relating to the ninth embodiment.

This laser management system is basically configured in the same way as the laser device management system of the second embodiment shown in FIG. 11, but differs from the second embodiment in that aligner is connected to the LAN.

That is, this laser device management system includes a plurality of semiconductor fabrication apparatus 411, 412, 413 connected to a monitor terminal 414 via a LAN 415 in a single factory 410. Monitor terminal 414 is also connected to a server device 417 via a network 416.

The items of aligner 411A, 412A, 413A in the plurality of semiconductor fabrication apparatus 411, 412, 413 are connected to LAN 415. Maintenance data acquired by the laser control apparatus by way of each of these items of aligner is transmitted to monitor terminal 414. The state of each item of aligner can also be transmitted to monitor terminal 414 at the same time.

A plurality of display terminals 418A, 418B, 418C are connected to server device 417 via network 416, and are also connected to monitor devices in factories 410A, 410B via network 416.

Similar configurations to that of the constituent elements in factory 410 are also provided in factories 410A, 410B.

The semiconductor fabrication apparatus, monitor terminals and server devices have the same functions as those of the laser device management system of the second embodiment shown in FIG. 11, so their description is omitted here.

With this ninth embodiment, it is possible to use an existing computer integrated manufacturing system (CIM) circuit when data is collected by way of the aligner. Furthermore, it is possible to manage data from the aligner in addition to the laser devices.

[Tenth Embodiment]

This tenth embodiment assumes a laser device management system in which upward compatibility is not maintained between a plurality of programs of different versions.

That is, when a plurality of versions of a device program are present in order to cater for different end-users or laser devices (or laser control apparatus that control these laser devices), it is sometimes inappropriate to always apply a monitor terminal program or a display terminal program corresponding to the most up-to-date version to all the monitor terminals or display terminals. In such cases, upward compatibility cannot be maintained between the plurality of monitor terminal programs or the plurality of display terminal programs of different versions.

Therefore, the tenth embodiment assumes a laser device management system in which it is possible to gather and display accurate maintenance data for each laser device even when upward compatibility is not maintained, for example.

Like the sixth embodiment, a laser device management system relating to this tenth embodiment is configured in the same way as the laser device management system of the second embodiment shown in FIG. 11.

Figure 24:
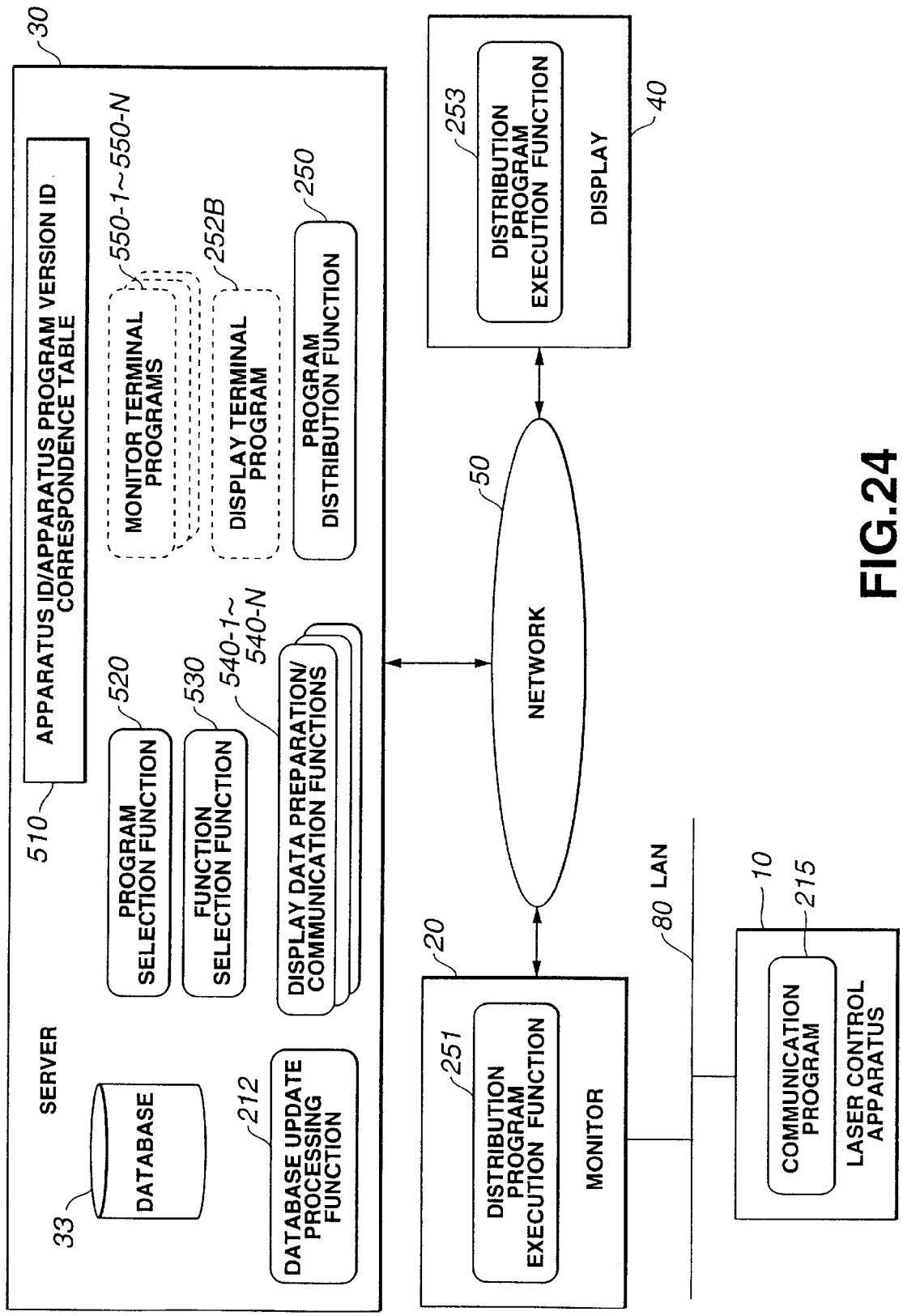
FIG. 24 shows a functional representation of a laser device management system relating to a tenth embodiment.

FIG. 24 shows a functional representation of a laser device management system relating to the tenth embodiment.

The laser device management system shown in FIG. 24 is configured by adding the laser control apparatus 10 of the second embodiment shown in FIG. 12 to the configuration of the laser device management system of the sixth embodiment shown in FIG. 20, and by changing the function of server device 30. In this figure, parts that perform the same functions as constituent elements shown in FIG. 20 are given the same reference numerals.

The functional configuration of server device 30 is modified by adding an apparatus ID/device program version ID correspondence table (referred to as an ID correspondence table in the following) 510, a program selection function 520 and a function selection function 530, changing the display data preparation and communication function 223 into a plurality of (N) display data preparation and communication functions 540-1–540-N, and changing the monitor program 252A into a plurality of (N) monitor programs 550-1–550-N.

Figure 25:
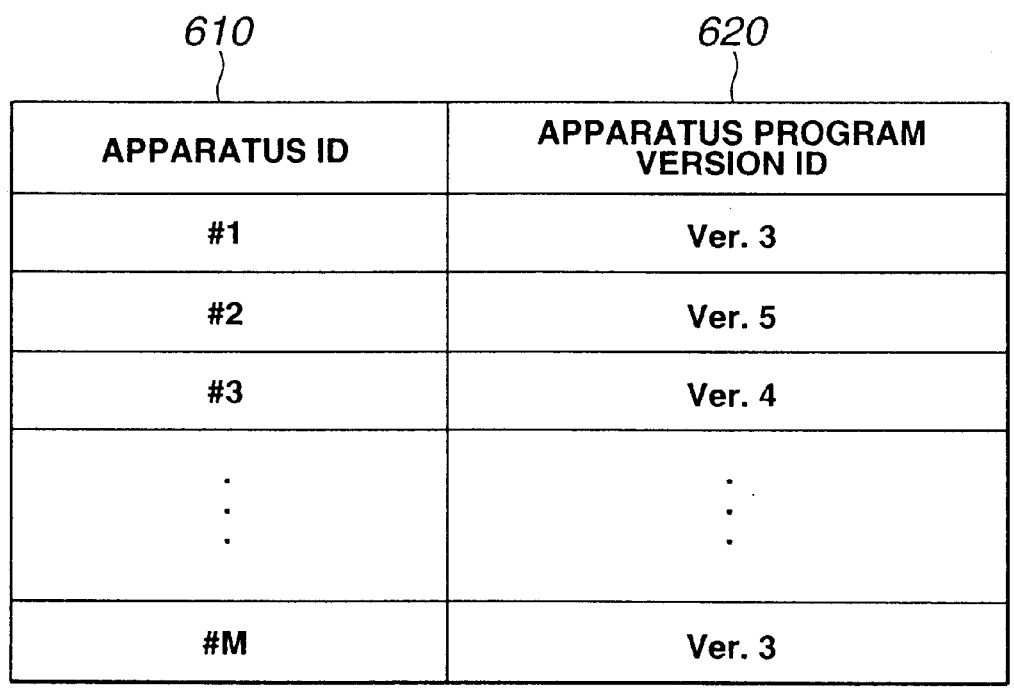
FIG. 25 is a view illustrating one example of apparatus ID/device program version ID correspondence table 510.

As FIG. 25 shows, ID correspondence table 510 consists of a region 610 that stores apparatus IDs, and a region 620 that stores identification data (referred to as device program version IDs in the following) indicating the version of the device program executed by the laser control apparatus indicated by the apparatus ID stored in this region 610.

In FIG. 25 it is assumed that a higher value for "Ver. No." in the device program version ID indicates a more recent version of the device program.

Program selection function 520 refers to the contents of ID correspondence table 510, identifies the device program version ID corresponding to the apparatus ID specified by monitor terminal 20, and selects the monitor terminal program corresponding to the abovementioned identified device program version ID from among the N different monitor terminal programs 550-1–550-N.

Function selection function 530 refers to the contents of ID correspondence table 510, identifies the device program version ID corresponding to the apparatus ID specified by display terminal 40, and selects the display data preparation and communication function corresponding to the identified device program version ID from among the N different display data preparation and communication functions 540-1–540-N.

The N different display data preparation and communication functions 540-1–540-N are display data preparation functions for preparing display data and communication functions for transmitting the prepared display data, and are provided corresponding to a plurality of device program version IDs. If there are ten device program version IDs, for example, then there are also ten (N=10) display data preparation and communication functions.

In this tenth embodiment, differences in processing by the device program corresponding to a device program version ID are absorbed by the display data preparation function; meanwhile, the display terminal program has a function for displaying the display data prepared by the display data preparation function, and is assumed to be no different to the program contents of the actual display terminal program of the device program corresponding to the device program version ID.

Accordingly, in the example mentioned above, in the case where there are ten device program version IDs, for example, there is only one display terminal program.

Of course, it is also possible to provide server device 30 with a plurality of display terminal programs corresponding to a plurality of device program version IDs. In this case, the display terminal program is selected based on the ID correspondence table 510 shown in FIG. 25 and the apparatus ID designated by display terminal 40.

The N different monitor terminal programs 550-1–550-N are provided corresponding to a plurality of device program version IDs, and are programs indicating the processing procedures of the processes to be executed by monitor terminal 20. If there are ten device program version IDs, for example, then there are ten (N=10) monitor terminal programs.

The ID correspondence table 510, program selection function 520, function selection function 530, the N different display data preparation and communication functions 540-1–540-N and the N different monitor programs 550-1–550-N are stored in external storage device 34 and are loaded into main memory 35 and executed when required (see FIG. 5).

In this tenth embodiment, it is assumed that display data preparation and communication functions 540-1–540-5 and monitor terminal programs 550-1–550-5 are selected corresponding to device program versions ID="Ver. 1"–"Ver. 5" respectively. For example, for the device program version ID="Ver. 4", it is assumed that that display data preparation and communication function 540-4 and monitor terminal program 550-4 are respectively selected.

In laser control apparatus 10, a program (i.e. a device program) indicating the processing procedure for controlling the laser device (which is the controlled object), a device program version ID which corresponds to the version of this device program, and the apparatus ID of this laser device are stored in external storage device 17B, and are loaded into memory 17A when required (see FIG. 2).

The processing performed by a laser device management system configured in this way is described with reference to FIGS. 26 and 27.

Figure 26:
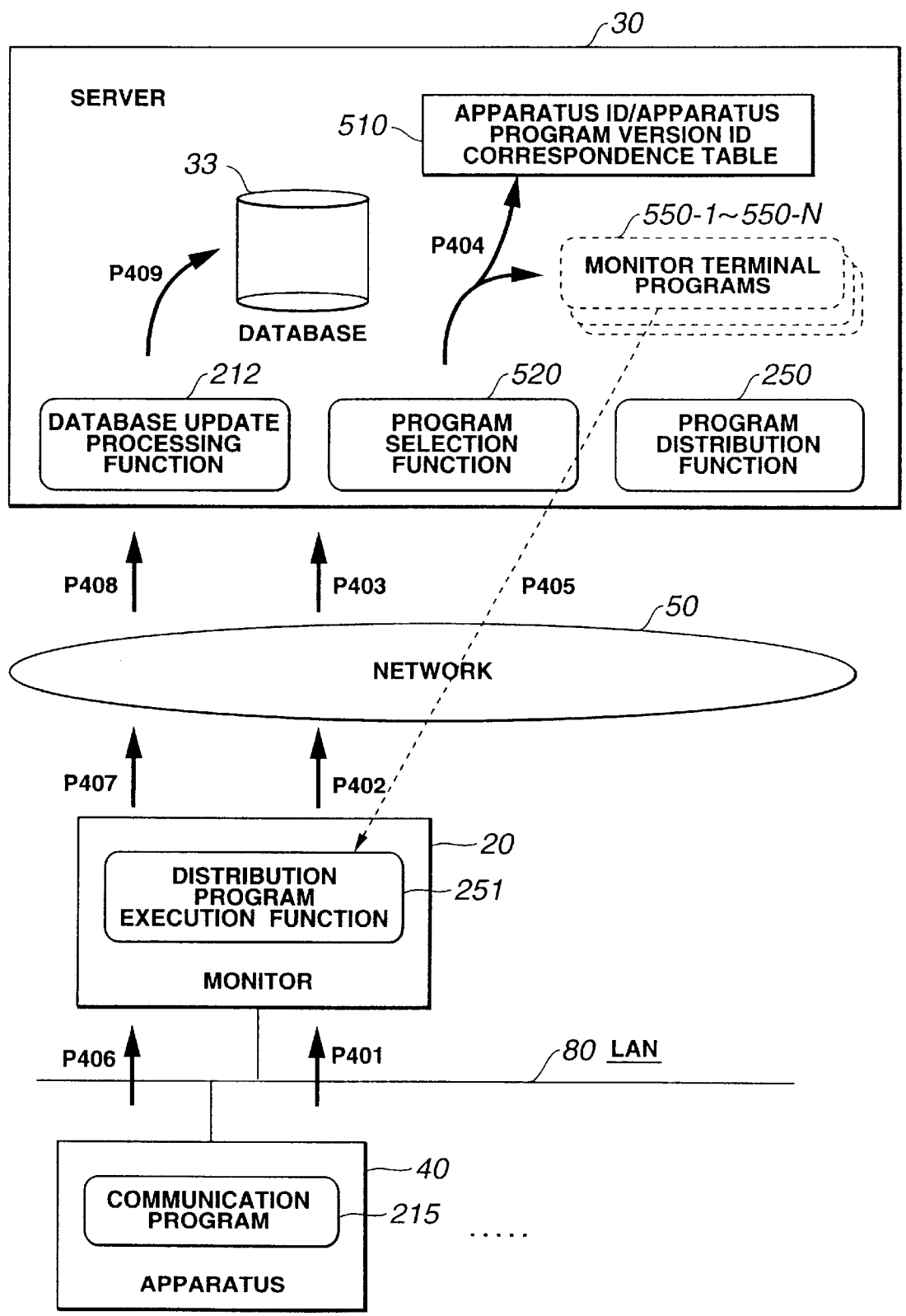
FIG. 26 is a view illustrating the transfer of maintenance data by monitor terminal 20.
Figure 27:
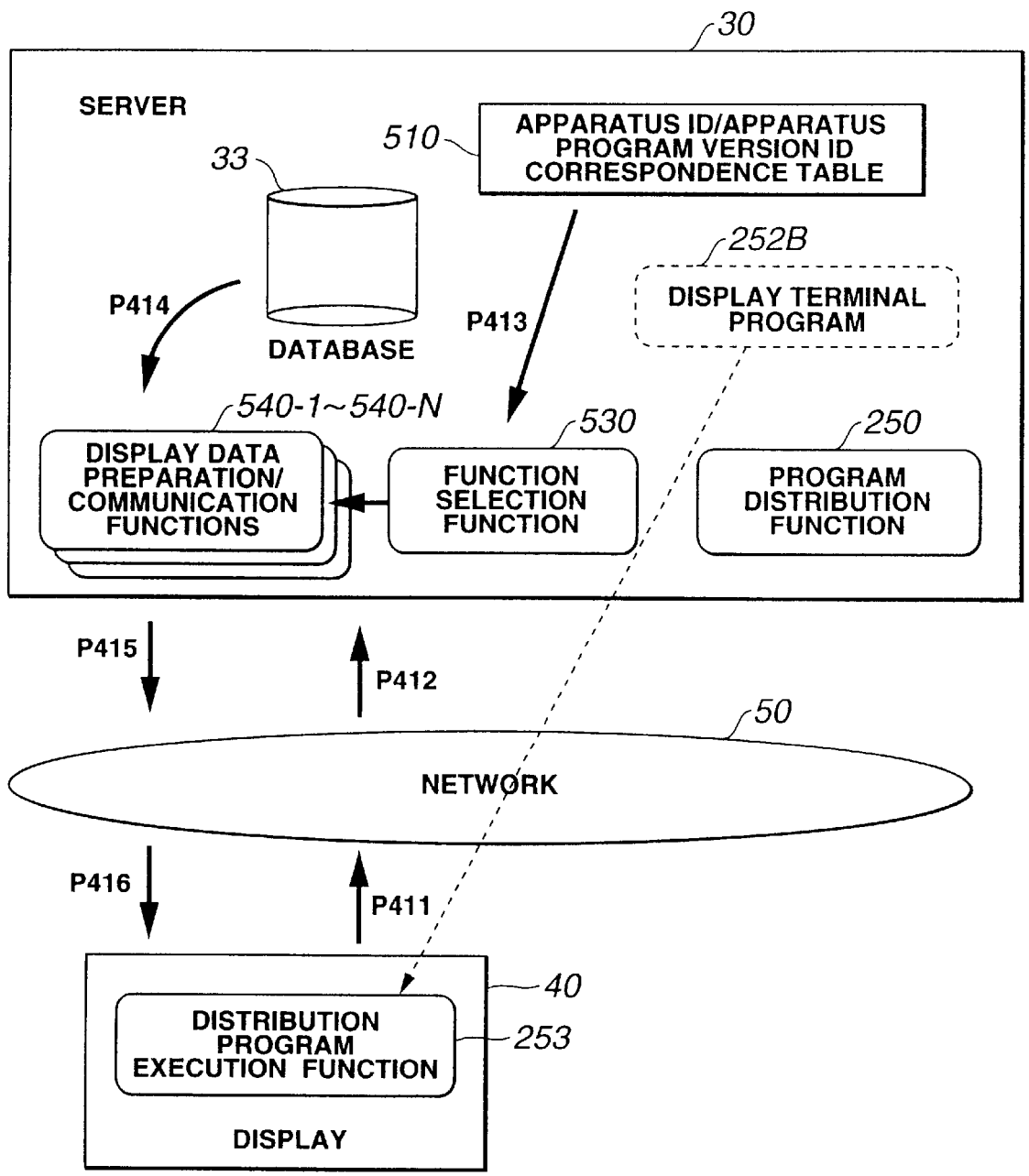
FIG. 27 is a view illustrating the display of maintenance data by display terminal 40.

FIG. 26 illustrates the transfer of maintenance data by monitor terminal 20, and FIG. 27 illustrates the display of maintenance data by display terminal 40.

The transfer of maintenance data by monitor terminal 20 is described first.

First, as shown in FIG. 26, when the device program executed by laser control apparatus 10 is upgraded, for example, the device program version ID of this device program and the apparatus ID corresponding to the laser device it controls are transmitted to monitor terminal 20 (process P401).

Here, it is assumed that the version of the device program of laser control apparatus 10 which controls the laser device indicated by apparatus ID=#1 is updated from "Ver. 3" to "Ver. 4". Accordingly, in process P401, the apparatus ID=#1 and device program version ID=Ver. 4 are transmitted from laser control apparatus 10 to monitor terminal 20.

In monitor terminal 20, the apparatus ID=#1 and device program version ID=Ver. 4 acquired from laser control apparatus 10 are transferred to server device 30. These items of data are received by server device 30 by way of network 50 (process P402, P403).

In server device 30, the monitor terminal program corresponding to the received device program version ID=Ver. 4 is selected from among the plurality of monitor terminal programs 550-1–550-N by program selection function 520, and ID correspondence table 510 is updated based on the apparatus ID=#1 and device program version ID=Ver. 4 already received (process P404).

In this process P404, monitor terminal program 550-4 is selected based on the device program version ID=Ver. 4, for example, and the entry in region 620 corresponding to apparatus ID=#1 in ID correspondence table 510 is updated from "Ver. 3" to "Ver. 4".

Next, in server device 30, the monitor terminal program 550-4 selected by program selection function 250 is loaded into main memory 35 from external storage device 34 and transmitted to monitor terminal 20 (process P405). This monitor terminal program 550-4 is downloaded into external storage device 22 of monitor terminal 20 by way of network 50.

Monitor terminal 20 loads the downloaded monitor terminal program 550-4 into main memory 23 from external storage device 22 and executes it. It also acquires maintenance data (maintenance data and an apparatus ID) from laser control apparatus 10 (process P406) and transfers this acquired maintenance data to server device 30. This maintenance data is received by server device 30 by way of network 50 (process P407, P408).

Once server device 30 has received the maintenance data in this way, it uses database updating function 212 to update database 33 based on the received maintenance data (process P409).

The display of maintenance data by display terminal 40 is described next.

Here it is assumed that display terminal program 252B has already been downloaded into display terminal 40. It is also assumed that display terminal 40 monitors the state of the laser device indicated by apparatus ID=#1.

To display the maintenance data for the laser device to be monitored, display terminal 40 transmits a display request along with the apparatus ID of this laser device (#1 in this example) to server device 30 (process P411, P412). These items of data are received by server device 30 by way of network 50.

Server device 30 uses function selection function 530 to specify the device program version ID based on the received apparatus ID=#1 by referring to ID correspondence table 510, and selects the display data preparation and communication function corresponding to this specified device program version ID (process P413).

In this process P413, the device program version ID=Ver. 4 corresponding to apparatus ID=#1 is specified based on ID correspondence table 510, and display data preparation and communication function 540-4 is selected from among the plurality of display data preparation and communication functions based on this device program version ID=Ver. 4.

Next, server device 30 prepares display data based on the data saved in database 33 and display data preparation and communication function 540-4 selected by function selection function 530 (process P414), and transmits it to display terminal 40 (process P415, P416). This display data is received by display terminal 40 by way of network 50.

In display terminal 40, the display data from server device 30 is displayed on display device 45 by using distribution program execution function 253 to execute the display terminal program 252B downloaded earlier.

With the tenth embodiment as described above, by acquiring a device program version and selecting a display data preparation and communication function or monitor terminal program corresponding to this version, it is possible to collect and display the maintenance data correctly even when the device programs executed by each laser device have different versions.

What is claimed is:

1. A laser device management system comprising a laser control apparatus that controls a laser device for an aligner that generates laser light based on a state of the laser device, a server device having a database, and an output terminal having output means that outputs output data based on contents of the database; the laser control apparatus, the server device and the output terminal being connected via a communication channel; and data communication is performed at least among the laser control apparatus, a display terminal and the server device via the communication channel;

the laser control apparatus acquiring a state data from the laser device indicating a state of the laser device and transmitting the state data to the server device through the communication channel when a preset event relating to the laser device has occurred, the server device comprising storage means for storing the state data transmitted from the processing means in the database, and generation means for generating output data based on contents of the database and transmitting the output data to the output terminal.

2. The laser device management system according to claim 1, wherein the generation means of the server device diagnoses the state of the laser device based on state data obtained in a fixed time in the past and stored in the database, generating output data indicating result of the diagnosis and transmitting the output data to the output terminal.

3. The laser device management system according to claim 1, wherein generation means of the server device diagnoses the state of the laser device based on most recent state data stored in the database and on preset diagnosis criteria, generating output data indicating result of the diagnosis and transmitting the output data to the output terminal.

4. The laser device management system according to claim 1, wherein, when the laser device is a gas laser device, the laser control apparatus acquires as the state data indicating the number of discharge pulses in the gas laser device state, and transmits the state data to the server device, and the generation means of the server device predicts errors in the state of the gas laser device based on data indicating most recent number of discharge pulses stored in the database, generates output data indicating result of the prediction, and transmits the output data to the output terminal.

5. The laser device management system according to claim 1, wherein, when the laser device is a gas laser device for performing laser oscillation of a gas laser, the laser control apparatus acquires as the state data indicating the operational status of the gas laser device including the number of discharge pulses that affects lifetime of components used in the gas laser device, and transmits the state data to the server device, and the generation means of the server predicts the lifetime of the components based on the state data stored in the database, generates output data indicating result of the prediction, and transmits the output data to the output terminal.

6. The laser device management system according to claim 1, wherein the event comprises a passage of a fixed amount of time.

7. The laser device management system according to claim 1, wherein the event comprises an operation for a fixed amount of time.

8. The laser device management system according to claim 1, wherein the event comprises a fixed number of discharge pulses.

9. The laser device management system according to claim 1, wherein the event comprises an occurrence of an error.

10. The laser device management system according to claim 1, wherein the event comprises a warning.

11. The laser device management system according to claim 1, wherein the event comprises an operation record after implementing maintenance work.

12. The laser device management system according to claim 1, wherein the event comprises completion of a periodic operation inherent to the laser device.

13. The laser device management system according to claim 1, wherein the event comprises a manual log acquisition command.

14. The laser device management system according to claim 1, wherein the event comprises a command for remote log acquisition by communication.

15. The laser device management system according to claim 1, further comprising a monitor terminal that monitors a state of the laser device for an aligner that generates laser light, wherein the laser control apparatus transmits the state data to the server device via the monitor terminal through the communication.

16. The laser device management system according to claim 15, wherein the server device further comprises:

storage means for storing a first program that executes a prescribed process to be implemented by the monitor terminal, and a second program that executes a prescribed process to be implemented by the display terminal; and program transmission means for transmitting the first program to the monitor terminal or transmitting the second program to the output terminal according to a transmission request from the monitor terminal or the display terminal; and the monitor terminal further comprises first execution means for executing a first program transmitted by the program transmission means, and the output terminal further comprises second execution means for executing a second program transmitted by the program transmission means.

17. The laser device management system according to claim 15, wherein the output terminal further comprises first transmission means for transmitting values of parameters affecting output characteristics of the laser device to the server device;

the server device further comprises second transmission means for transmitting parameters from the first transmission means to the monitor terminal; and the monitor terminal further comprises transfer means for transferring the parameters from the second transmission means to the laser device.

18. A laser device management system comprising laser control apparatus and a display which are connected to a communication channel to which are connected a server device having a database for storing state data indicating a state of a laser device transmitted from a transmitting apparatus and generating means for generating output data based on contents of the database and transmitting the data to a destination apparatus, the laser control apparatus and the display terminal performing data communication with the server device via this communication channel;

the laser control apparatus acquiring a state data indicating a state of the laser device from the laser device and transmitting the state data to the communication channel when a preset event relating to an aligner that generates laser light has occurred, and the display terminal comprising output means for outputting output data based on contents of the database from the server device received via the communication channel.

19. The laser device management system according to claim 18, wherein the generation means of the server device diagnoses the state of the laser device based on state data obtained in a fixed time in the past and stored in the database, generating output data indicating result of the diagnosis and transmitting the output data to the output terminal.

20. The laser device management system according to claim 18, wherein generation means of the server device diagnoses the state of the laser device based on most recent state data stored in the database and on preset diagnosis criteria, generating output data indicating result of the diagnosis and transmitting the output data to the output terminal.

21. The laser device management system according to claim 18, wherein, when the laser device is a gas laser device, the laser control apparatus acquires as the state data indicating the number of discharge pulses in the gas laser device state, and transmits the state data to the server device, and the generation means of the server device predicts errors in the state of the gas laser device based on data indicating most recent number of discharge pulses stored in the database, generates output data indicating result of the prediction, and transmits the output data to the output terminal.

* * * * *